United States Patent
Yamakawa et al.

(10) Patent No.: US 9,735,347 B2
(45) Date of Patent: Aug. 15, 2017

(54) MAGNETIC MEMORY DEVICE AND METHOD OF MANUFACTURING THE SAME

(71) Applicant: KABUSHIKI KAISHA TOSHIBA, Minato-ku, Tokyo (JP)

(72) Inventors: Koji Yamakawa, Yokkaichi Mie (JP); Katsuaki Natori, Yokkaichi Mie (JP); Shinichi Kanoo, Yokkaichi Mie (JP); Kenji Noma, Yokkaichi Mie (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 15/065,819

(22) Filed: Mar. 9, 2016

(65) Prior Publication Data
US 2017/0062705 A1    Mar. 2, 2017

Related U.S. Application Data

(60) Provisional application No. 62/213,590, filed on Sep. 2, 2015.

(51) Int. Cl.
| | | |
|---|---|---|
| H01L 29/82 | (2006.01) | |
| H01L 43/08 | (2006.01) | |
| H01L 43/02 | (2006.01) | |
| H01L 43/10 | (2006.01) | |
| H01L 43/12 | (2006.01) | |
| G11C 11/16 | (2006.01) | |

(52) U.S. Cl.
CPC .............. H01L 43/08 (2013.01); H01L 43/02 (2013.01); H01L 43/10 (2013.01); H01L 43/12 (2013.01); G11C 11/161 (2013.01)

(58) Field of Classification Search
CPC ......... H01L 43/08; H01L 43/02; H01L 43/12; H01L 43/10; G11C 11/161
See application file for complete search history.

(56) References Cited

U.S. PATENT DOCUMENTS

| | | | |
|---|---|---|---|
| 8,653,614 | B2 | 2/2014 | Ikeno et al. |
| 2003/0049389 | A1 | 3/2003 | Tsunekawa et al. |
| 2004/0085687 | A1 | 5/2004 | Sharma et al. |
| 2009/0206425 | A1 | 8/2009 | Tsujiuchi |
| 2010/0018946 | A1 | 1/2010 | Isowaki et al. |
| 2010/0176472 | A1 | 7/2010 | Shoji |
| 2010/0200939 | A1 | 8/2010 | Hosomi et al. |
| 2011/0084347 | A1 | 4/2011 | Shin et al. |
| 2011/0188157 | A1 | 8/2011 | Zhao et al. |
| 2011/0233700 | A1 | 9/2011 | Hayakawa et al. |
| 2012/0112297 | A1 | 5/2012 | Yamakawa et al. |
| 2014/0021426 | A1 | 1/2014 | Lee et al. |

FOREIGN PATENT DOCUMENTS

| | | |
|---|---|---|
| JP | 2009055050 A | 3/2009 |
| JP | 2012182217 A | 9/2012 |

*Primary Examiner* — John C Ingham
*Assistant Examiner* — Wasiul Haider
(74) *Attorney, Agent, or Firm* — Holtz, Holtz & Volek PC

(57) ABSTRACT

According to one embodiment, a magnetic memory device includes: a first magnetic layer; a nonmagnetic layer on the first magnetic layer; a second magnetic layer on the nonmagnetic layer; and an insulator film on the nonmagnetic layer surrounding a side surface of the second magnetic layer. The second magnetic layer has an area of a surface facing the nonmagnetic layer smaller than that of the nonmagnetic layer. The nonmagnetic layer includes a first region that is provided between the first magnetic layer and the insulator film. The first region includes an amorphous state.

13 Claims, 25 Drawing Sheets

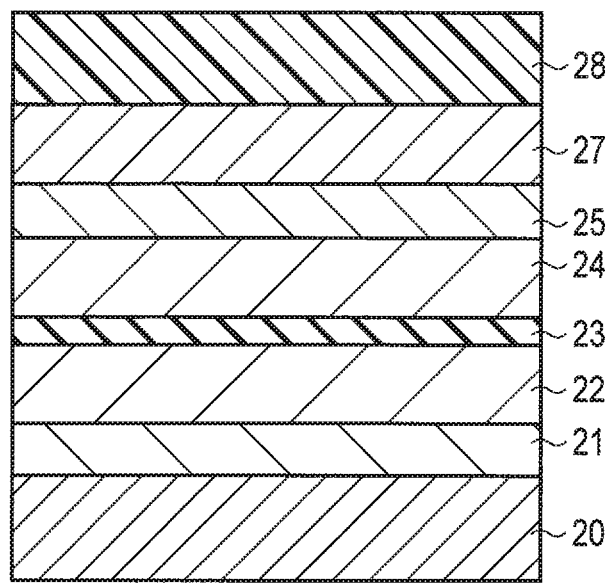
F I G. 3
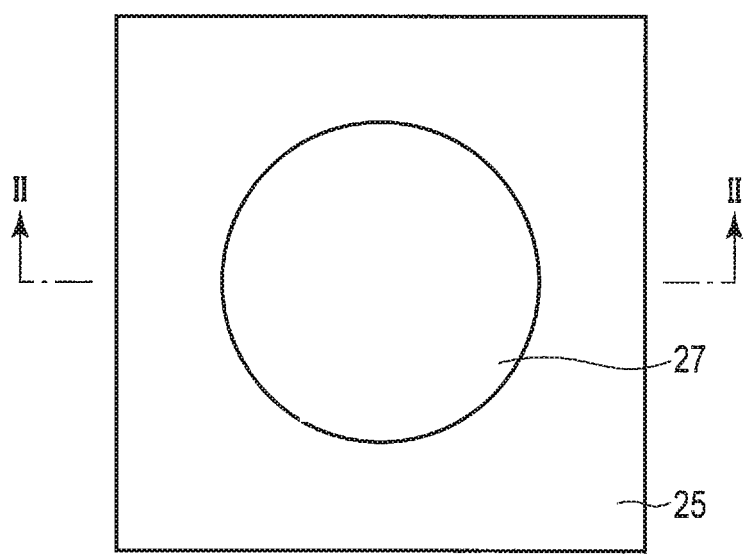
F I G. 4

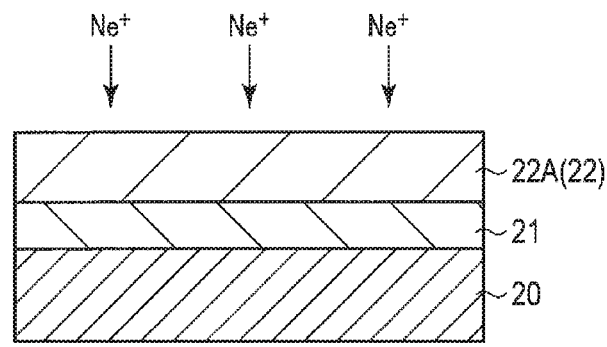
F I G. 29
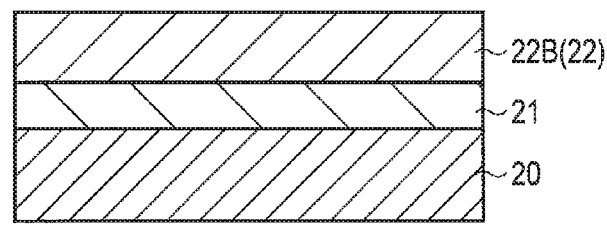
F I G. 30
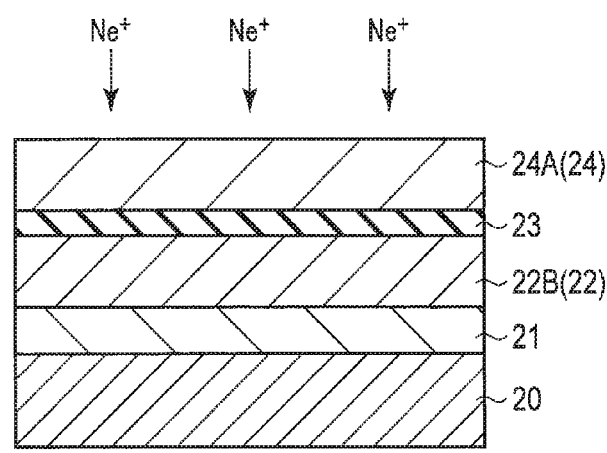
F I G. 31

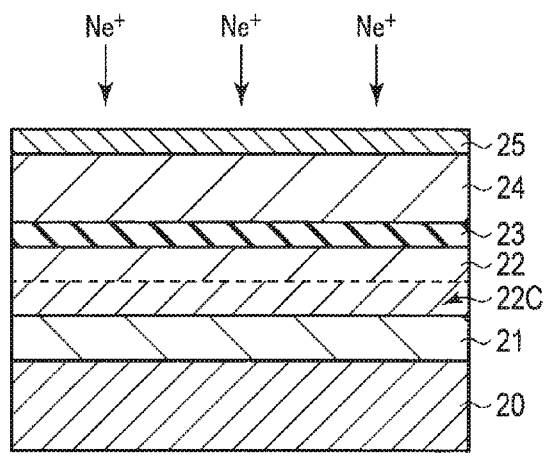
F I G. 38
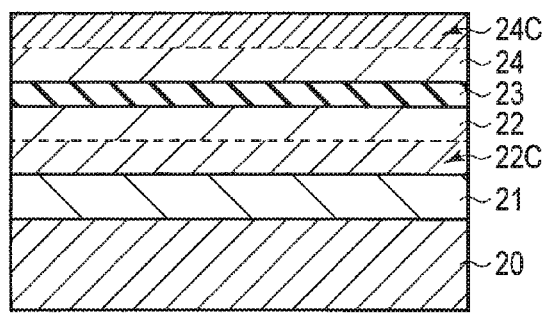
F I G. 39
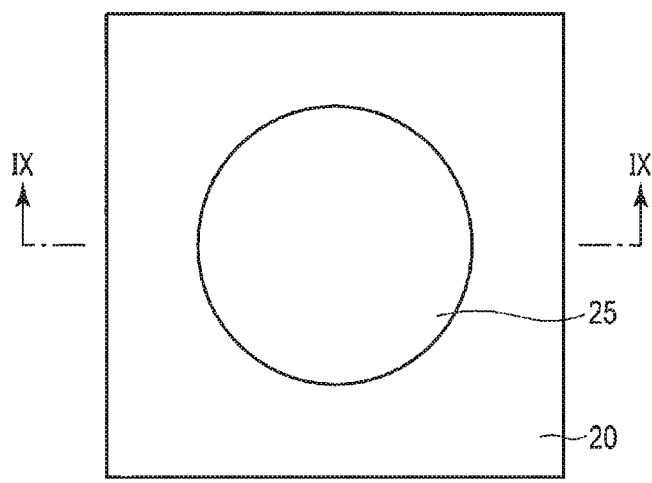
F I G. 40

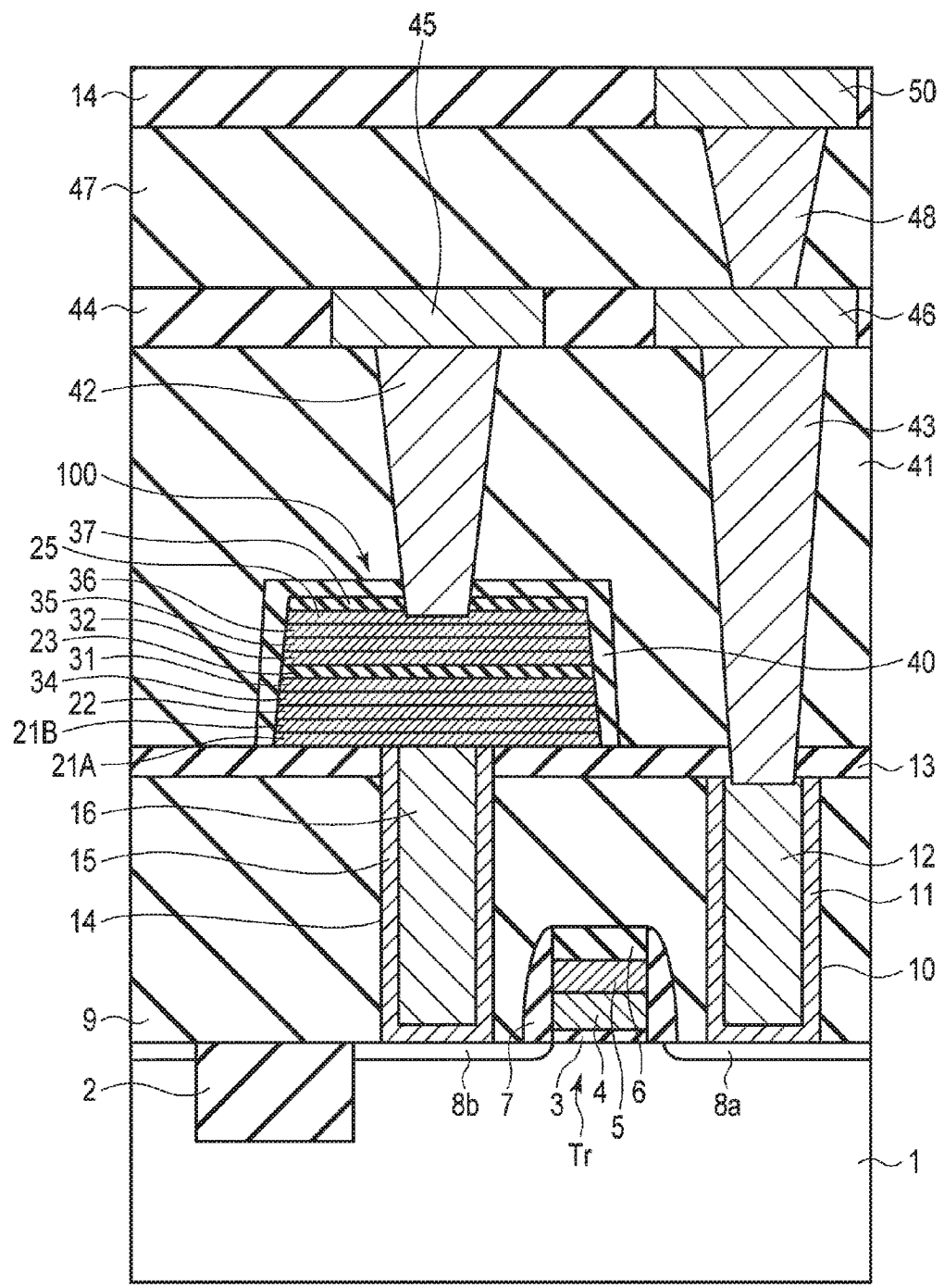
F I G. 48

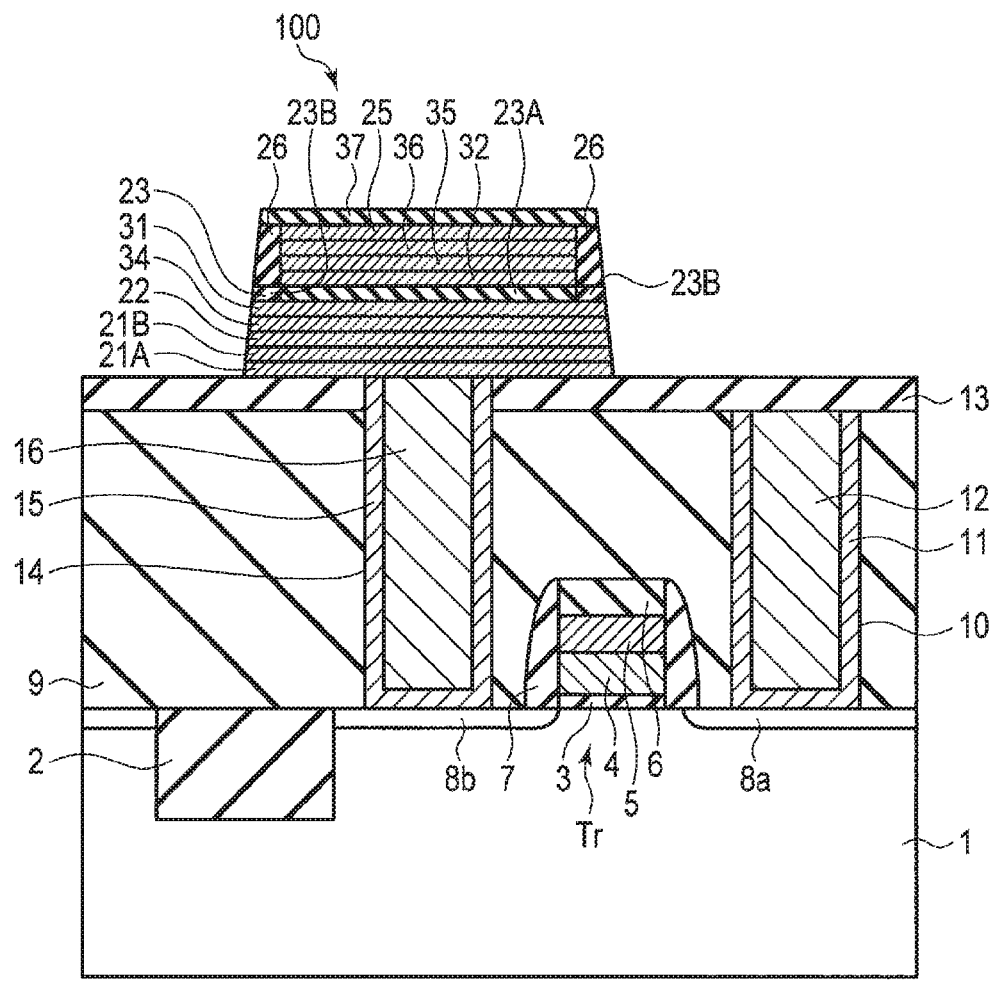
F I G. 49

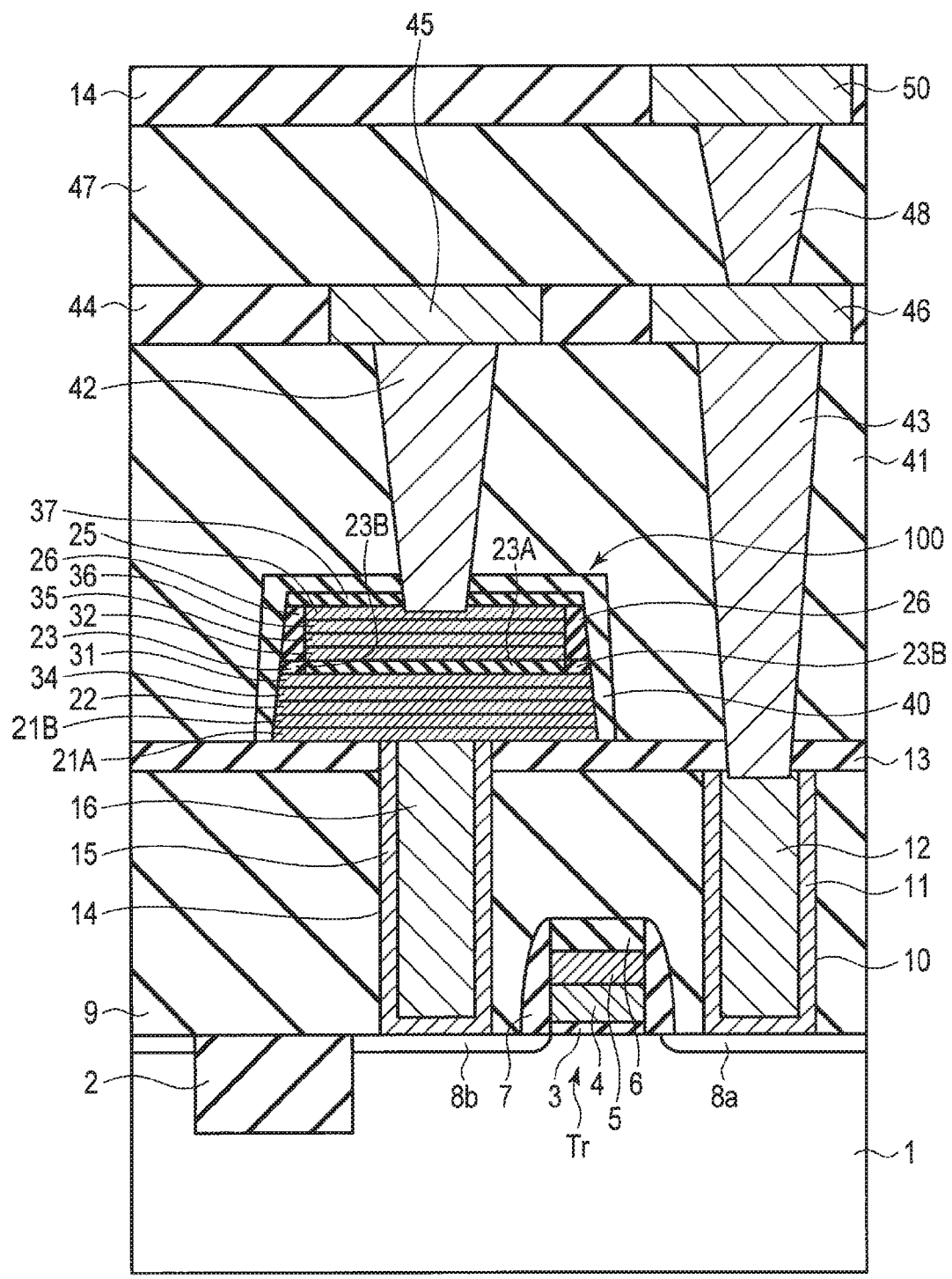
F I G. 50

MAGNETIC MEMORY DEVICE AND METHOD OF MANUFACTURING THE SAME

CROSS-REFERENCE TO RELATED APPLICATIONS

This application claims the benefit of U.S. Provisional Application No. 62/213,590, filed Sep. 2, 2015, the entire contents of which are incorporated herein by reference.

FIELD

Embodiments described herein relate generally to a magnetic memory device and method of manufacturing the same.

BACKGROUND

A resistance change memory is known as a kind of semiconductor memory device. A magnetoresistive random access memory (MRAM) is known as a kind of resistance change memory. The MRAM features a high-speed operation, a large capacity, and nonvolatileness, and has been researched and developed as a next-generation memory device that replaces a volatile memory such as a DRAM or SRAM.

In the MRAM, a magnetic memory device using a tunneling magnetoresistive (TMR) effect is used as a memory cell for storing information. As the magnetic memory device, an magnetic tunnel junction (MTJ) element having a stacked layer of metal magnetic film/insulating film/metal magnetic film is used. A change in the resistance of the MTJ element is determined by the magnetization states of the metal magnetic films that sandwich the insulating film. That is, the MRAM stores data according to the magnetization state of the MTJ element.

The characteristics of the MTJ element are represented using a write current, a magnetoresistive ratio (MR ratio), and the like as indices, and are affected by the processes of forming the MTJ element. The characteristics of the MTJ element lower or vary due to the influence of, for example, the planarity of an underlayer used when stacking layers or the element isolation process of the MTJ element. To reduce a write/erase current and improve the MR ratio while ensuring a high data retention characteristic, it is necessary to improve the structure and manufacturing method of the MTJ element.

BRIEF DESCRIPTION OF THE DRAWINGS

FIG. 3 is a sectional view showing a process in the manufacture of the MTJ element according to the first embodiment;

FIG. 4 is a plan view showing a process in the manufacture of the MTJ element according to the first embodiment;

FIG. 29, FIG. 30, FIG. 31, FIG. 32, and FIG. 33 are sectional view showing processes in the manufacture of the MTJ element according to the seventh embodiment, sequentially;

FIG. 36, FIG. 37, FIG. 38, and FIG. 39 are sectional view showing processes in the manufacture of the MTJ element according to the eighth embodiment, sequentially;

FIG. 40 is a plan view showing a process in the manufacture of an MTJ element according to the ninth embodiment;

FIG. 45, FIG. 46, FIG. 47, and FIG. 48 are sectional view showing processes in the manufacture of the MRAM according to arrangement example 1; and FIG. 49 and FIG. 50 are sectional view showing processes in the manufacture of the MRAM according to arrangement example 2.

DETAILED DESCRIPTION

Figure 1:
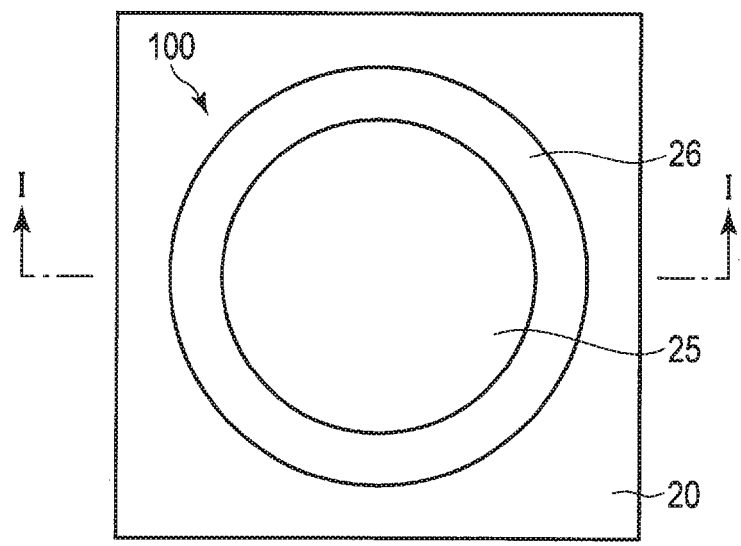
FIG. 1 is a plan view showing an MTJ element according to the first embodiment.

In general, according to one embodiment, a magnetic memory device includes: a first magnetic layer; a nonmagnetic layer on the first magnetic layer; a second magnetic layer on the nonmagnetic layer; and an insulator film on the nonmagnetic layer surrounding a side surface of the second magnetic layer. The second magnetic layer has an area of a surface facing the nonmagnetic layer smaller than that of the nonmagnetic layer. The nonmagnetic layer includes a first region that is provided between the first magnetic layer and the insulator film. The first region includes an amorphous state.

Embodiments will now be described with reference to the accompanying drawing. Note that in the following explanation, the same reference numerals denote constituent elements having almost the same functions and arrangements. The drawings are schematic. The embodiments merely exemplify devices and methods for embodying the technical concepts of the embodiments, and the technical concepts of the embodiments do not limit the materials, shapes, structures, layouts, and the like of the components to those to be described below.

[1] FIRST EMBODIMENT

A magnetic memory device according to the first embodiment is an magnetic tunnel junction (MTJ) element. A tunnel barrier layer provided between a lower magnetic layer and a side wall provided on the side surface of an upper magnetic layer has an amorphous state. The magnetic memory device will be referred to as an MTJ element in the following description.

[1-1] Structure of MTJ Element

Figure 2:
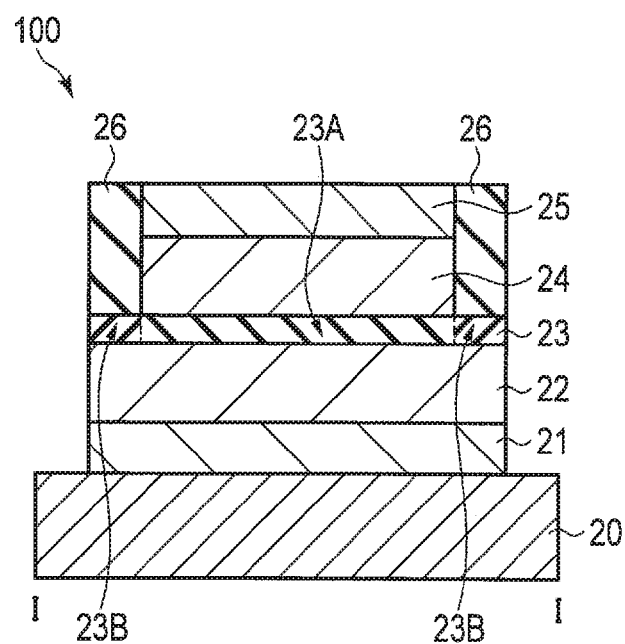
FIG. 2 is a sectional view of the MTJ element taken along a line I-I in FIG. 1.

The structure of an MTJ element 100 according to the first embodiment will be described with reference to FIGS. 1 and 2 by exemplifying a case in which a perpendicular magnetization film is used as a storage layer. FIG. 1 is a plan view showing the MTJ element 100 according to the first embodiment. FIG. 2 is a sectional view of the MTJ element 100 taken along a line I-I in FIG. 1.

As shown in FIG. 1, the planar shape of the MTJ element 100 is, for example, circular or elliptic. Note that the planar shape of the MTJ element 100 is not limited to this, and various forms can be employed.

As shown in FIG. 2, the MTJ element 100 has a structure in which an underlayer 21, a reference layer (fixed layer) 22, a tunnel barrier layer (nonmagnetic layer) 23, a storage layer (free layer) 24, and a cap layer 25 are sequentially stacked on a lower electrode 20. A protective film 26 is provided on the side surfaces of the storage layer 24 and the cap layer 25 so as to cover the periphery.

The MTJ element 100 stores data according to the magnetization states of the storage layer 24 and the reference layer 22 that sandwich the tunnel barrier layer 23. More specifically, the MTJ element 100 uses a characteristic representing that the resistance value of the MTJ element 100 changes depending on whether the magnetization states of the storage layer 24 and the reference layer 22 are parallel or antiparallel. If the magnetization states are parallel, the MTJ element 100 has a low resistance state. If the magnetization states are antiparallel, the MTJ element 100 has a high resistance state. The MTJ element 100 can thus store data by defining, for example, the low resistance state and the high resistance state as "0" and "1", respectively. The allocation of the resistance state of the MTJ element 100 to data can arbitrarily be set.

The storage layer 24 and the reference layer 22 are ferromagnetic layers and have a magnetic anisotropy perpendicular to the film surfaces. In the storage layer 24 and the reference layer 22, the magnetization direction (direction of easy magnetization) is perpendicular to the film surface. The MTJ element 100 having a perpendicular magnetization direction will be referred to as a perpendicular magnetization type MTJ element 100 in the following description.

The magnetization switching current of the storage layer 24 is smaller than that of the reference layer 22. The magnetization switching current is a current capable of switching the magnetization of the magnetic layer.

As the storage layer 24 and the reference layer 22 that implement the perpendicular magnetization type MTJ element 100, a magnetic material having an $L1_0$ structure or $L1_2$ structure based on an face-centered tetragonal (fct) structure with an orientation along the (001) plane with respect to the in-plane direction is used. To implement perpendicular magnetization in the storage layer 24 and the reference layer 22, a material having a magnetocrystalline anisotropy energy density of $5 \times 10^5$ erg/cc or more is preferably used.

As the magnetic material of the storage layer 24, for example, a perpendicular magnetization film of an artificial lattice formed by stacking an element such as iron (Fe), cobalt (Co), nickel (Ni), manganese (Mn), chromium (Cr), platinum (Pt), palladium (Pd), iridium (Ir), rhodium (Rh), ruthenium (Ru), osmium (Os), rhenium (Re), or gold (Au) or an alloy thereof is used. More specifically, as the perpendicular magnetization film of an artificial lattice, a film formed by stacking a combination of a magnetic layer and a nonmagnetic layer, for example, Co/Pt, Co/Pd, or Co/Ru is used. The magnetic characteristic of the storage layer 24 is adjusted by the composition of the magnetic layer, the ratio of the magnetic layer to the nonmagnetic layer, and the like. In addition, the storage layer 24 can also be provided using an antiferromagnetic film such as PtMn or IrMn in combination with an Ru film. As the storage layer 24, for example, CoFeB that is an alloy is used. The characteristic of CoFeB changes depending on the composition ratio of Co and Fe and the concentration of boron (B). Hence, CoFeB having properties suitable for the structure of the MTJ element 100 is used.

As the magnetic material of the reference layer 22, an ordered alloy having an $L1_0$ structure, for example, FePd, FePt, or the like is used. The saturation magnetization and the magnetic anisotropy energy density of the ordered alloy layer can be adjusted by adding an element such as copper (Cu). The reference layer 22 can also use the same structure as the storage layer 24. Note that to fix the magnetization direction of the reference layer 22 to one direction, an antiferromagnetic layer may be provided next to the reference layer 22. As the antiferromagnetic layer, for example, an alloy of Mn and Fe, Ni, Pt, Pd, Ru, Os, or Ir, that is, FeMn, NiMn, PtMn, PdMn, RuMn, OsMn, or IrMn, or CrPtMn or the like is used.

The tunnel barrier layer 23 is formed from an insulating film and functions as the barrier between the storage layer 24 and the reference layer 22. As the tunnel barrier layer 23, an oxide whose crystal structure is an NaCl structure is preferably used. For example, magnesium oxide (MgO), calcium oxide (CaO), strontium oxide (SrO), titanium oxide (TiO), vanadium oxide (VO), niobium oxide (NbO), or alumina ($Al_2O_3$) is used. When the tunnel barrier layer 23 is crystal-grown on an alloy structure mainly containing Fe, Co, Ni, or the like, the tunnel barrier layer 23 formed from an insulating film with a (100) preferred orientation can be obtained. As the alloy mainly containing Fe, Co, Ni, or the like, for example, amorphous CoFeB is used. The tunnel barrier layer 23 has a film thickness of, for example, about 10 Å and a sheet resistance value of, for example, 10 $\Omega\mu m^2$.

The lower electrode 20 is made of a metal and used to connect a circuit (not shown) that uses the MTJ element 100. The size of the lower electrode 20 can appropriately be set. If the size of the lower electrode 20 is smaller than that of the underlayer 21, the underlayer 21 is provided on the lower electrode 20 and on an interlayer dielectric film around the lower electrode 20.

The underlayer 21 connects the lower electrode 20 and the reference layer 22, and controls the orientation of the reference layer 22. As the underlayer 21, a refractory metal such as Pt, Ir, Ru, or Cu is used. Note that the underlayer 21 may be divided into a lower metal layer in contact with the lower electrode 20 and an orientation control film that controls the orientation of the reference layer 22. In this case, as the lower metal layer, for example, Ta, W, Ti, or the like is used. As the orientation control film, for example, Pt, Ir, or Ru, or a stacked film thereof is used.

The cap layer 25 connects the storage layer 24 and an upper electrode layer (not shown). As the cap layer 25, a metal such as Ru or Ta is used. If the storage layer 24 is made of CoFeB, boron (B) may be removed when crystallizing the layer. Hence, as the cap layer 25, Ta, Ti, hafnium (Hf), zirconium (Zr), or the like is used. These materials have the effect of absorbing boron when crystallizing amorphous CoFeB. Note that the material used for the cap layer 25 preferably has a small current value (switching current) at the time of switching because it is in contact with the storage layer 24 that makes magnetization switching. This current value is determined by the friction coefficient, attenuation constant, and damping constant between the storage layer 24 and the cap layer 25. To make these constants small and reduce the switching current, not a metal film but an oxide film, a nitride film, a boride film, a carbide film, or the like may be selected.

The protective film 26 is provided to surround the side surface of the storage layer 24, and prevents a short circuit between the storage layer 24 and the reference layer 22 caused by a side surface residue generated in the element isolation process of the MTJ element 100. That is, the MTJ element 100 has a side wall structure with the protective film 26 provided on the side surface of the storage layer 24. As the protective film 26, an insulating material is preferably used. For example, $Al_2O_3$, a silicon oxide film ($SiO_2$), TiOx, a silicon nitride film (SiN), or the like is used. If the protective film 26 is an SiN film, the protective film 26 is formed by, for example, CVD (Chemical Vapor Deposition). The SiN film may be formed by nitriding a deposited polysilicon film. Note that the area of the storage layer 24 is smaller than that of the reference layer 22 because the protective film 26 is provided.

In the MTJ element 100 according to the first embodiment, the reference layer 22 and the tunnel barrier layer 23 have almost the same area, and the storage layer 24 has an area smaller than that of the reference layer 22. A region 23A of the tunnel barrier layer 23 between the reference layer 22 and the storage layer 24 has a crystalline state, and a region 23B of the tunnel barrier layer 23 between the reference layer 22 and the protective film 26 has an amorphous state. Details will be described later.

A shift adjustment layer may be provided between the reference layer 22 and the underlayer 21 or between the storage layer 24 and the cap layer 25. When the shift adjustment layer is provided, a nonmagnetic layer is provided between the shift adjustment layer and the reference layer 22 or between the shift adjustment layer and the storage layer 24. The shift adjustment layer has a magnetization direction set to be antiparallel to the reference layer 22, and suppresses a leakage magnetic field applied to the storage layer 24. The nonmagnetic layer has a heat resistance to prevent thermal diffusion and a function of controlling the crystal orientation. As the shift adjustment layer, for example, the same material as the reference layer 22 is used. As the nonmagnetic layer, a nonmagnetic metal such as ruthenium (Ru), silver (Ag), or copper (Cu) is used. Note that if the nonmagnetic layer becomes thick, the distance between the shift adjustment layer and the storage layer 24 increases, and the magnetic field applied from the shift adjustment layer to the storage layer 24 becomes small. For this reason, the film thickness of the nonmagnetic layer is preferably, for example, 5 nm or less.

Each of the reference layer 22, the nonmagnetic layer, and the shift adjustment layer may have an synthetic antiferromagnetic (SAF) structure. At this time, for example, ruthenium is used as the nonmagnetic layer (coupling layer). The magnetization directions of the reference layer 22 and the shift adjustment layer are set to be antiparallel using antiferromagnetic coupling by ruthenium. The coupling layer has a film thickness of, for example, 4 Å and a coupling magnetic field of, for example, 5 to 8 kOe.

Interface magnetic layers may be provided between the reference layer 22 and the tunnel barrier layer 23 and between the storage layer 24 and the tunnel barrier layer 23. The interface magnetic layer is made of a material having a high polarization ratio. The MTJ element 100 in which the interface magnetic layer is introduced can obtain a large TMR effect. The interface magnetic layer needs to attain interface matching between the storage layer 24 or reference layer 22 and the (100) plane of the tunnel barrier layer 23 made of an oxide with a NaCl structure. Hence, as the interface magnetic layer, a material having a small lattice mismatch to the (100) plane of the tunnel barrier layer 23 is preferably selected. For example, CoFeB is used.

In addition, diffusion prevention films may be provided between the reference layer 22 and the interface magnetic layer and between the storage layer 24 and the interface magnetic layer. The diffusion prevention films prevent the metal elements of the layers from diffusing in heat treatment processes such as crystallization of the tunnel barrier layer 23, insulating film formation, reactive ion etching (RIE), and interconnection formation in the manufacturing process of the MRAM. The diffusion prevention films also hold the crystallinity of the interface magnetic layer, the storage layer 24, and the reference layer 22. The diffusion prevention films can thus suppress degradation of the magnetic characteristics of the storage layer 24 and the reference layer 22 and the electrical characteristics (TMR effect and the like) of the MTJ element 100. As the diffusion prevention film, a film made of a refractory metal such as Ti, Ta, W, Zr, Hf, molybdenum (Mo), or niobium (Nb), or a nitride or carbide thereof is used.

Note that the MTJ element 100 has a shape with a side surface extending in a direction perpendicular to the lower electrode 20. The taper angle of the side surface of the MTJ element 100 is preferably 80° or more, and more preferably, 85° or more. This enables high integration of elements.

As each of the storage layer 24 and the reference layer 22, an in-plane magnetization film having a magnetic anisotropy parallel to the film surface may be used. At this time, the direction of easy magnetization of the storage layer 24 is parallel to the film surface (or stacking surface). As the in-plane magnetization storage layer 24 and reference layer 22, for example, a magnetic metal containing one of iron (Fe), cobalt (Co), nickel (Ni), manganese (Mn), and chromium (Cr) is usable.

The MTJ element 100 shown in FIGS. 1 and 2 has a top free structure in which the storage layer 24 is provided above the reference layer 22. The MTJ element 100 is not limited to this, and may have a bottom free structure in which the storage layer 24 is provided under the reference layer 22. In a case of the bottom free structure, the MTJ element 100 has a structure in which the underlayer 21, the storage layer 24, the tunnel barrier layer 23, the reference layer 22, and the cap layer 25 are sequentially stacked on the lower electrode 20. The protective film 26 is provided on the side surface of the reference layer 22, and a region of the tunnel barrier layer 23 between the storage layer 24 and the protective film 26 has an amorphous state. The stacked structure of the MTJ element 100 is not limited to this, and various forms can be employed.

[1-2] Method of Manufacturing MTJ Element

A method of manufacturing the MTJ element 100 according to the first embodiment will be described with reference to FIGS. 3, 4, 5, 6, and 7. FIGS. 3, 4, 5, 6, and 7 are plan and sectional views showing processes in the manufacture of the MTJ element 100 according to the first embodiment. Characteristic parts of the processes in the manufacture of the MTJ element 100 will be described below in detail.

First, as shown in FIG. 3, the underlayer 21, the reference layer 22, the tunnel barrier layer 23, the storage layer 24, the cap layer 25, a hard mask 27, and a resist 28 are sequentially formed on the lower electrode 20 using a known method. The reference layer 22 and the storage layer 24 are made of, for example, CoFeB. The tunnel barrier layer 23 is made of, for example, MgO and has a crystalline state. The hard mask 27 is made of, for example, $SiO_2$ or SiN. Note that a metal film may be used as the hard mask 27.

Figure 5:
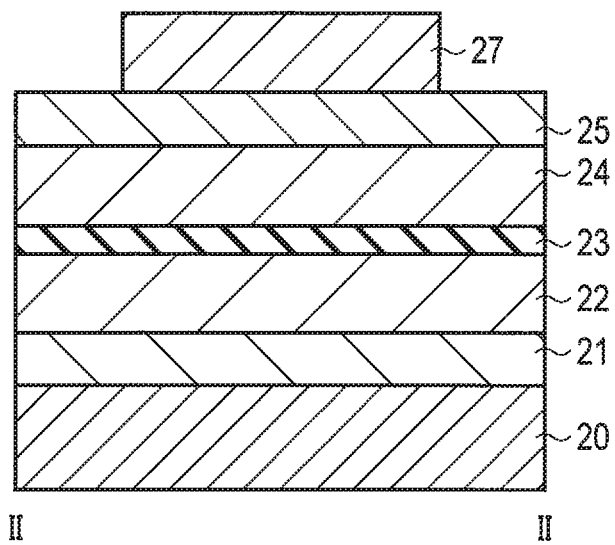
FIG. 5 is a sectional view of the MTJ element taken along a line II-II in FIG. 4.

Next, as shown in FIGS. 4 and 5, a desired pattern is formed on the resist 28 using photolithography, and the hard mask 27 is processed. In this processing, for example, physical processing by ion beam etching (IBE) is used. After the processing of the hard mask 27, the resist 28 is removed.

Figure 6:
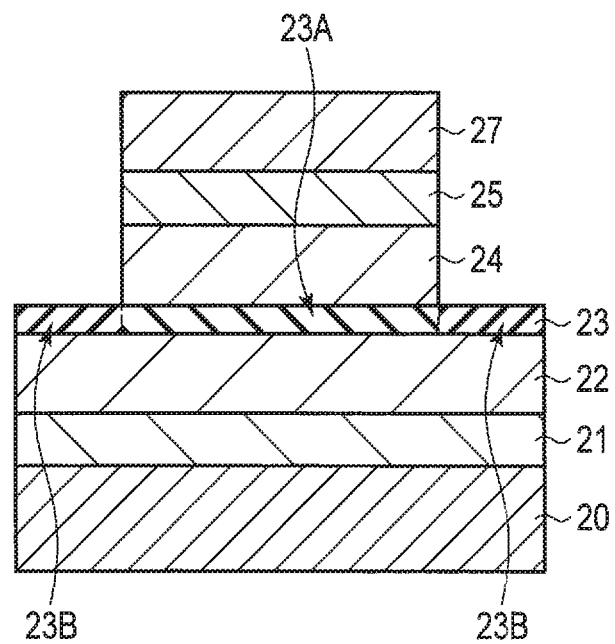
FIG. 6 and FIG. 7 are sectional view showing processes in the manufacture of the MTJ element according to the first embodiment, sequentially.

As shown in FIG. 6, the layers above the tunnel barrier layer 23 are processed using the processed hard mask 27. In this processing, for example, physical processing by IBE using neon gas as an inert gas is used. The IBE using neon gas will be referred to as Ne etching in the following description. In the IBE of this process, the processing condition, process gas species, post-processing, and the like are preferably optimized so as not to leave the residue in the processing on the side wall of the MTJ element 100. In the IBE of this process, for example, neon gas is supplied in a state in which a DC/RF bias is applied to the substrate side on which the MTJ element 100 is to be formed. As the etching condition at this time, for example, an RF bias of 13.56 MHz is applied to the coil of a vacuum chamber to convert the neon gas into a plasma, and a low frequency of 1 MHz or less is applied to the substrate side, thereby causing etching at low energy. In this process, the tunnel barrier layer 23 is irradiated with Ne ions. The portion irradiated with the Ne ions changes to an amorphous state as the Ne ions are implanted. That is, the region 23A in the crystalline state and the region 23B in the amorphous state are formed in the tunnel barrier layer 23. The region 23B in the amorphous state may be formed only in the upper portion of the tunnel barrier layer 23 or may reach the lower portion of the tunnel barrier layer 23. The region 23B in the amorphous state contains the element of the inert gas used for IBE.

Figure 7:
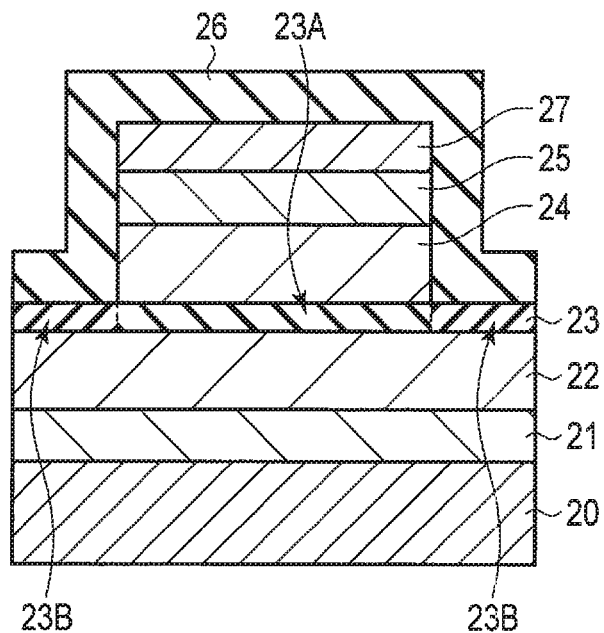

As shown in FIG. 7, the protective film 26 is formed so as to cover the upper surface of the MTJ element 100. At this time, to prevent damage to the layers, the protective film 26 is preferably formed using atomic layer deposition (ALD), chemical vapor deposition (CVD), physical vapor deposition (PVD), or the like.

Next, when the reference layer 22 and the underlayer 21 under the tunnel barrier layer 23 are etched by, for example, IBE using Ar as an inert gas, the structure shown in FIGS. 1 and 2 is obtained. Due to the directivity of the IBE, the portions on the bottom side of the tunnel barrier layer 23 are mainly etched, and the protective film 26 remains on the side surfaces of the storage layer 24 and the cap layer 25. The MTJ element 100 is thus element-isolated. The residue of the protective film 26 formed in this process serves as the side wall of the storage layer 24. Note that the protective film 26 may only cover the side surface of the storage layer 24.

In the above-described way, the MTJ element 100 according to the first embodiment is formed. The region 23A of the tunnel barrier layer 23 between the reference layer 22 and the storage layer 24 has the crystalline state, and the region 23B of the tunnel barrier layer 23 between the reference layer 22 and the protective film 26 changes to the amorphous state.

[1-3] Effects of First Embodiment

In the MRAM, when the size of the storage layer provided on one surface of the tunnel barrier layer in the MTJ element is made smaller than the size of the reference layer provided on the other surface, the influence of the leakage magnetic field from the reference layer can be reduced. It is therefore possible to obtain an MTJ element in which the magnetization switching characteristic by the spin current of the storage layer is improved, the switching current is reduced, and an excellent retention characteristic is ensured.

When element-isolating the MTJ element, the residue generated by ion beam etching (IBE), reactive ion etching (RIE), or the like adheres to the side surface of the MTJ element in some cases. Since the tunnel barrier layer made of MgO or the like is thin, the residue adhered to the side wall of the MTJ element easily causes a short circuit between the storage layer and the reference layer. In some cases, the electrical characteristic of the MTJ element degrades due to the same reason. To prevent this, before element isolation of the MTJ element, the magnetic layer formed on the upper surface of the tunnel barrier layer is etched. After the protective film (side wall) is formed to cover the upper surface of the processed structure, the MTJ element is element-isolated. This can provide an MTJ element having a side wall structure that prevents a short circuit caused by a residue on the side surface.

However, when argon (Ar) is used as the inert gas in IBE performed for side wall formation, Ar is implanted into the tunnel barrier layer, and the implanted Ar may reach the lower magnetic layer. In this case as well, the electrical characteristic of the MTJ element degrades.

To prevent this, in the MTJ element 100 according to the first embodiment, Ne lighter than Ar is used as the inert gas in IBE performed for side wall formation. By the IBE using the neon gas, processing can be performed up to the tunnel barrier layer 23 without implanting any element into the lower magnetic layer. Additionally, in this step, the tunnel barrier layer 23 in which the neon gas is implanted changes to the amorphous state.

Figure 8:
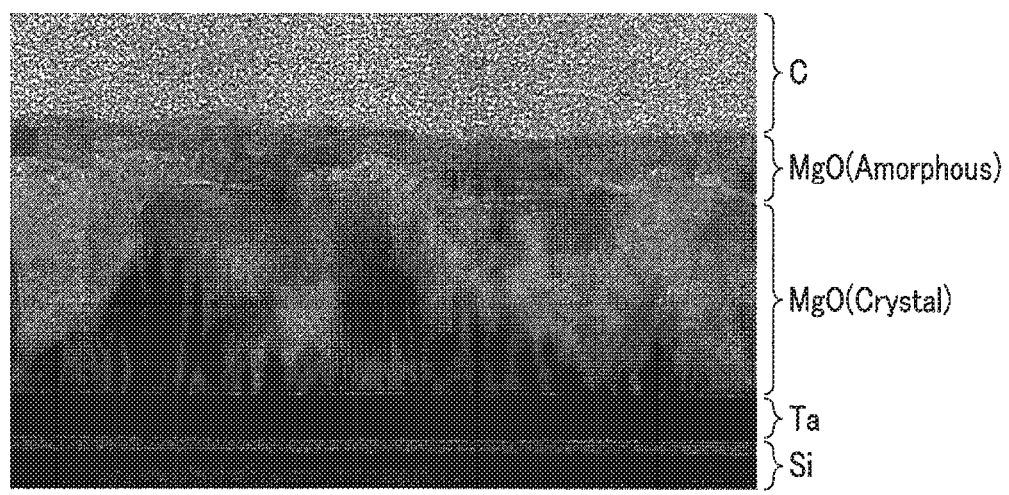
FIG. 8 is a sectional view showing the effect of the processes in the manufacture of the MTJ element according to the first embodiment.

Amorphization of the tunnel barrier layer 23 by Ne etching will be described with reference to FIG. 8. The stacked structure shown in FIG. 8 is obtained by sequentially stacking tantalum (Ta) and magnesium oxide (MgO) on a silicon substrate and performing IBE using neon gas for the MgO layer. For examination, the MgO layer is provided thicker (about 40 to 50 nm) than in a case in which the MgO layer is used in the MTJ element 100. In the stacked structure shown in FIG. 8, to acquire a sectional image, carbon (C) is deposited on the amorphized MgO layer.

As is apparent from FIG. 8, the upper portion of the MgO layer processed by IBE using neon gas has an amorphous state. Note that the tunnel barrier layer 23 in the amorphous state can suppress diffusion of a metal film element in contact with the tunnel barrier layer in annealing of post-processing and thus suppress degradation of the electrical characteristic of the MTJ element 100. In addition, the amorphized tunnel barrier layer 23 can be used as an etching stopper because its etching rate in IBE is low.

As described above, according to the first embodiment, it is possible to provide the MTJ element 100 that suppresses degradation of the electrical characteristic.

Note that in electrical characteristic evaluation of the MTJ element 100 according to the first embodiment, the element sheet resistance value (RA value) was 10 $\Omega\mu m^2$, and the magnetoresistive ratio (MR ratio) was 100% or more.

In the first embodiment, the MTJ element 100 has a top free structure in which the storage layer 24 is stacked above the reference layer 22. However, the structure is not limited to this, and a bottom free structure in which the positions of the reference layer 22 and the storage layer 24 are replaced may be employed.

Note that IBE for amorphizing the tunnel barrier layer 23 may use helium (He) as the inert gas in place of neon (Ne). When argon (Ar) is used as the inert gas in IBE, the same effects as described above can be obtained by adjusting the DC/RF bias and causing deceleration.

[2] SECOND EMBODIMENT

In the second embodiment, alteration processing such as oxidation, nitriding, or boronizing is performed for a metal hard mask used in element isolation of an MTJ element 100, thereby improving the etching selectivity of the metal hard mask.

A method of manufacturing the MTJ element 100 according to the second embodiment will be described with reference to FIGS. 9, 10, 11, and 12. FIGS. 9, 10, 11, and 12 are plan and sectional views showing steps in the manufacture of the MTJ element 100 according to the second embodiment.

Figure 9:
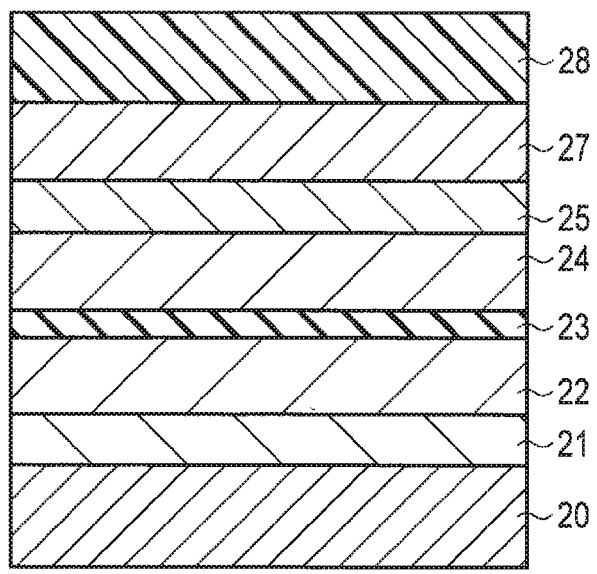
FIG. 9 is a sectional view showing a process in the manufacture of an MTJ element according to the second embodiment.

First, as shown in FIG. 9, an underlayer 21, a reference layer 22, a tunnel barrier layer 23, a storage layer 24, a cap layer 25, a hard mask 27, and a resist 28 are sequentially formed on a lower electrode 20. The hard mask 27 is made of a metal, for example, Mg.

Figure 10:
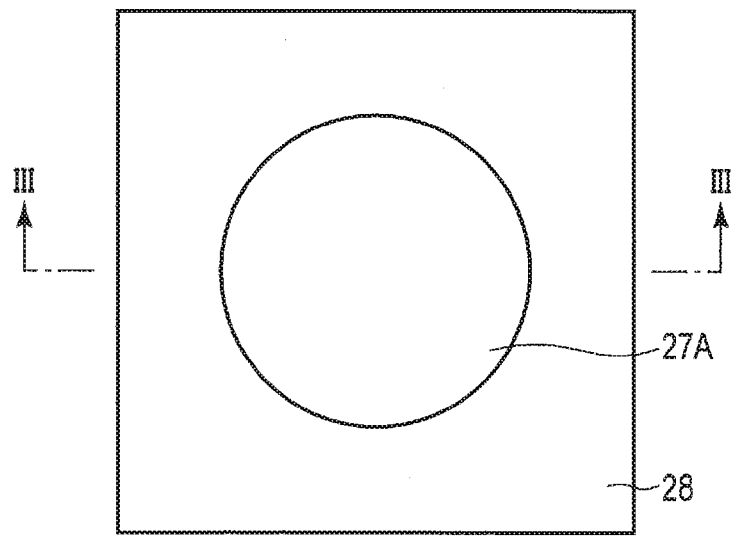
FIG. 10 is a plan view showing a process in the manufacture of the MTJ element according to the second embodiment.
Figure 11:
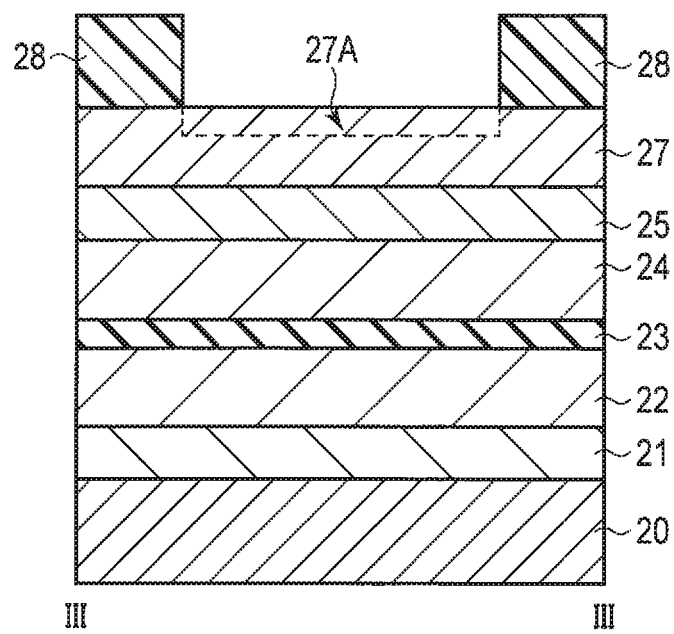
FIG. 11 is a sectional view of the MTJ element taken along a line III-III in FIG. 10.

Next, as shown in FIGS. 10 and 11, a desired pattern is formed on the resist 28 using photolithography, and processing such as oxidation, nitriding, or boronizing is performed for the hard mask 27. A portion of the hard mask 27 corresponding to the opening of the resist 28 alters to a hard mask 27A of a different reaction compound. The hard mask 27A is made of, for example, MgO.

Figure 12:
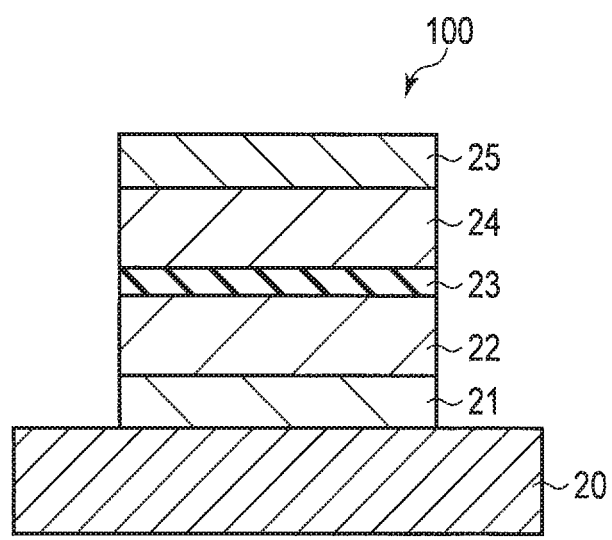
FIG. 12 is a sectional view showing a process in the manufacture of the MTJ element according to the second embodiment.

Next, as shown in FIG. 12, after removal of the resist 28, element isolation processing is performed using the hard masks 27 and 27A. In this processing, for example, physical processing by IBE using gas mainly containing Ar is used. Since the etching rate of the hard mask 27A is lower than that of the hard mask 27, the MTJ element 100 can be processed into a desired shape without patterning the hard mask 27 itself. In the MTJ element 100 after the processing, the hard mask 27A has been removed. If the hard mask 27A remains in the MTJ element 100 after the processing, it is removed by separately performing etching. On the other hand, the hard mask 27 made of a metal has a function as an electrode, and may therefore remain in the MTJ element 100.

As described above, in the manufacturing method of the MTJ element 100 according to the second embodiment, alteration processing of the hard mask 27 is performed, thereby forming a region in the hard mask 27 to which etching selectivity is imparted. This enables processing using the hard mask 27A that is hardly etched and improves the variation and the shape of the MTJ element 100 after the processing. It is therefore possible to provide the MTJ element 100 that suppresses degradation of the electrical characteristic.

Note that the manufacturing method of the MTJ element 100 according to the second embodiment is also applicable to the arrangement of the MTJ element 100 according to the first embodiment.

[3] THIRD EMBODIMENT

In the third embodiment, atoms are implanted into a metal hard mask used in element isolation of an MTJ element 100, thereby improving the etching selectivity of the metal hard mask.

A method of manufacturing the MTJ element 100 according to the third embodiment will be described with reference to FIGS. 13, 14, 15, 16, and 17. FIGS. 13, 14, 15, 16, and 17 are plan and sectional views showing steps in the manufacture of the MTJ element 100 according to the third embodiment.

Figure 13:
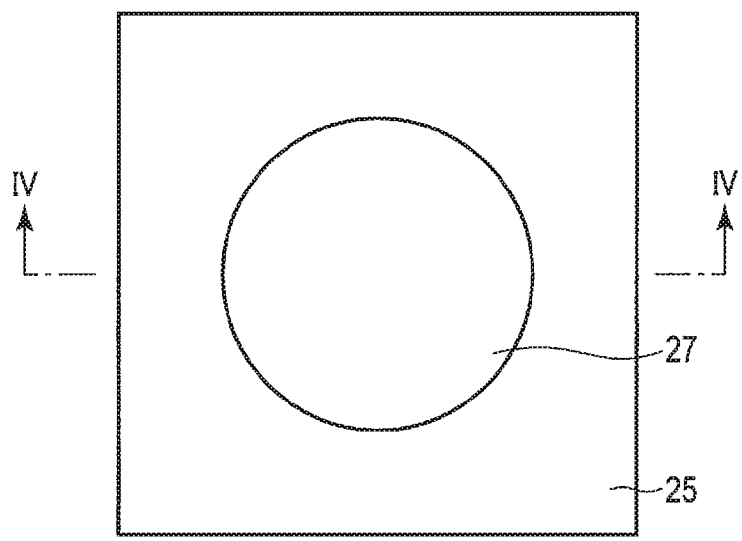
FIG. 13 is a plan view showing a process, following FIG. 12, in the manufacture of an MTJ element according to the third embodiment.
Figure 14:
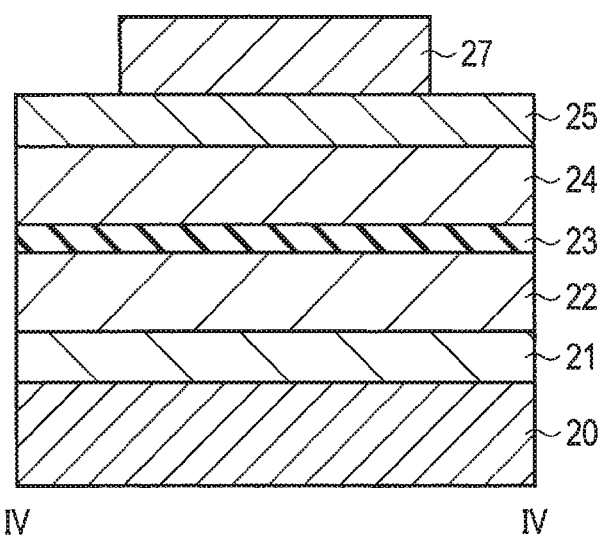
FIG. 14 is a sectional view of the MTJ element taken along a line IV-IV in FIG. 13.

First, as shown in FIGS. 13 and 14, an underlayer 21, a reference layer 22, a tunnel barrier layer 23, a storage layer 24, a cap layer 25, and a hard mask 27 are sequentially formed on a lower electrode 20. The hard mask 27 is processed by photolithography and etching. As the hard mask 27, a metal such as tantalum (Ta), titanium (Ti), tungsten (W), or molybdenum (Mo) is used.

Figure 15:
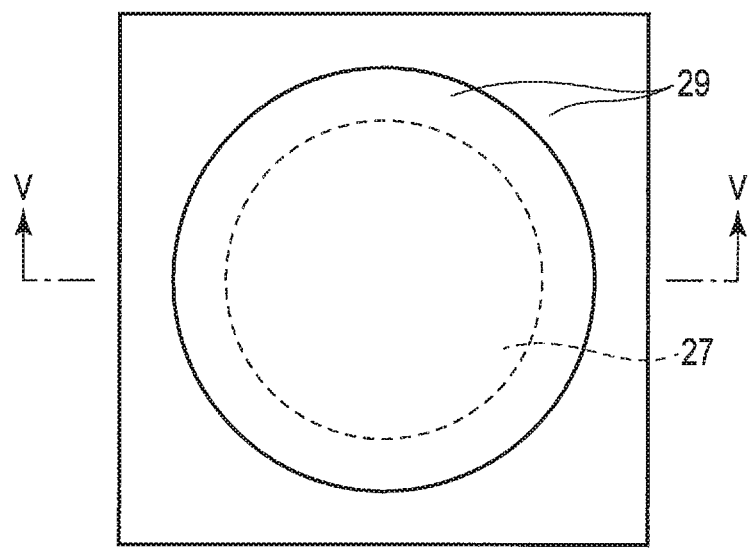
FIG. 15 is a plan view showing a process in the manufacture of the MTJ element according to the third embodiment.
Figure 16:
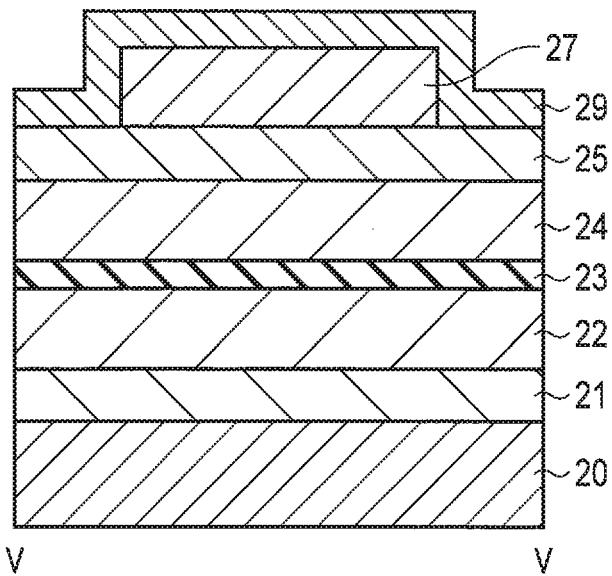
FIG. 16 is a sectional view of the MTJ element taken along a line V-V in FIG. 15.

Next, as shown in FIGS. 15 and 16, an additive atom film 29 is formed so as to cover the upper surface of the MTJ element 100 using, for example, chemical vapor deposition (CVD) or physical vapor deposition (PVD). The additive atom film 29 is made of a material different from that of the hard mask 27. As the additive atom film 29, nonmetal atoms such as carbon (C), boron (B), or silicon (Si) or metal atoms such as tantalum (Ta) are used.

Figure 17:
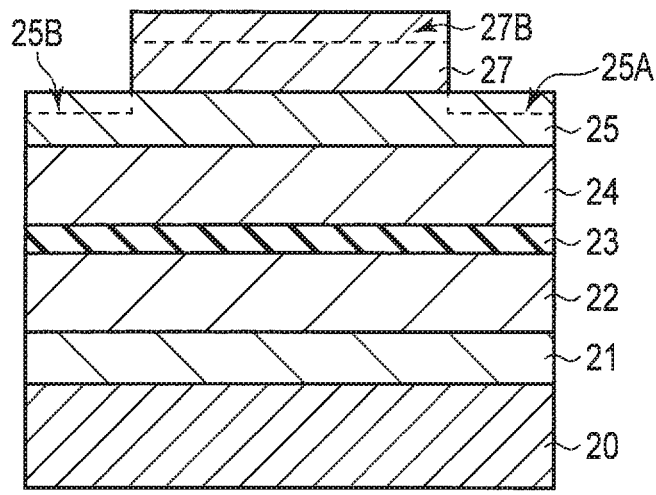
FIG. 17 is a sectional view showing a process in the manufacture of the MTJ element according to the third embodiment.

As shown in FIG. 17, the additive atom film 29 is etched by Ne etching. Then, the atoms contained in the additive atom film 29 are implanted into the hard mask 27. The region of the hard mask 27 where the atoms contained in the additive atom film 29 are implanted will be referred to as a hard mask 27B. The hard mask 27B has an improved etching selectivity compared to the hard mask 27. At this time, a region 25A where the atoms contained in the additive atom film 29 are implanted is formed in the cap layer 25 as well. However, the etching selectivity of the region 25A of the cap layer 25 is different from that of the hard mask 27B.

Next, element isolation processing is performed using the hard masks 27 and 27B. In this processing, for example, physical processing by IBE using Ar as the inert gas is used. The etching rate of the hard mask 27B is lower than that of the hard mask 27, and the MTJ element 100 can stably be element-isolated. In the MTJ element 100 after the processing, the hard mask 27B has been removed. If the hard mask 27B remains in the MTJ element 100 after the processing, it is removed by separately performing etching. The MTJ element 100 thus obtains the same structure as that shown in FIG. 12.

As described above, in the manufacturing method of the MTJ element 100 according to the third embodiment, metal or nonmetal atoms are implanted into the hard mask 27, thereby forming a region in the hard mask 27 to which etching selectivity is imparted. This enables processing using the hard mask 27B that is hardly etched and improves the variation and the shape of the MTJ element 100 after the processing. It is therefore possible to provide the MTJ element 100 that suppresses degradation of the electrical characteristic.

Note that the processing of implanting the atoms of the additive atom film 29 into the hard mask 27 may use helium (He) as the inert gas in place of neon (Ne). The same effects as described above can be obtained even by IBE in which argon (Ar) is used as the inert gas, and the DC/RF bias is adjusted to cause deceleration.

In addition, the manufacturing method of the MTJ element 100 according to the third embodiment is also applicable to the arrangement of the MTJ element 100 according to the first embodiment.

[4] FOURTH EMBODIMENT

The fourth embodiment is a modification of the third embodiment, in which a metal hard mask is processed after implanting different atoms into it.

A method of manufacturing an MTJ element 100 according to the fourth embodiment will be described with reference to FIGS. 18, 19, 20, and 21. FIGS. 18, 19, 20, and 21 are plan and sectional views showing steps in the manufacture of the MTJ element 100 according to the fourth embodiment.

Figure 18:
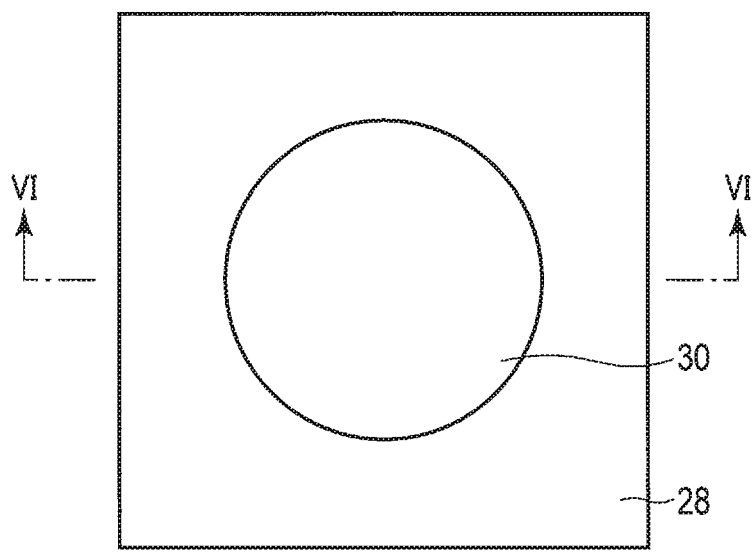
FIG. 18 is a plan view showing a process in the manufacture of an MTJ element according to the fourth embodiment.
Figure 19:
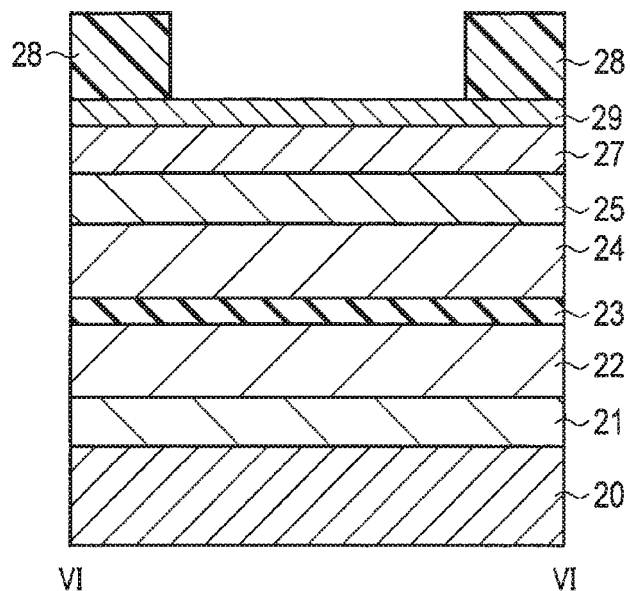
FIG. 19 is a sectional view of the MTJ element taken along a line VI-VI in FIG. 18.

First, as shown in FIGS. 18 and 19, an underlayer 21, a reference layer 22, a tunnel barrier layer 23, a storage layer 24, a cap layer 25, a hard mask 27, an additive atom film 29, and a resist 28 are sequentially formed on a lower electrode 20. The resist 28 is processed into a desired pattern by photolithography. As the hard mask 27, a metal such as tantalum (Ta), titanium (Ti), tungsten (W), or molybdenum (Mo) is used.

Figure 20:
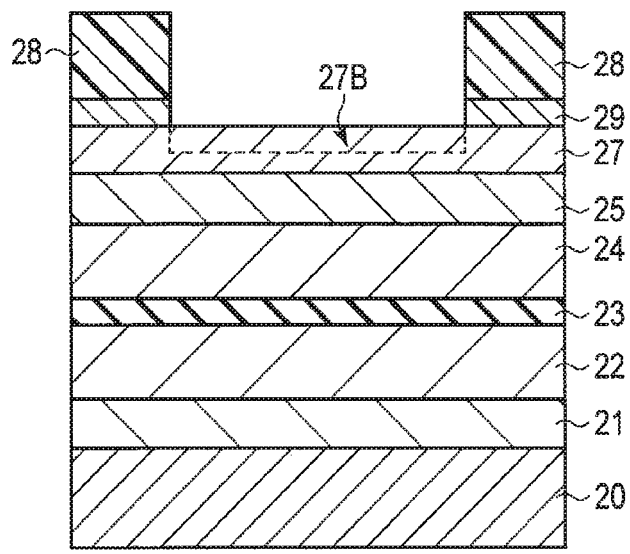
FIG. 20 and FIG. 21 are sectional view showing processes in the manufacture of the MTJ element according to the fourth embodiment, sequentially.

Next, as shown in FIG. 20, the additive atom film 29 in the opening portion of the resist 28 is etched by Ne etching.

Then, the atoms contained in the additive atom film 29 are implanted into the hard mask 27, and a hard mask 27B is formed.

Figure 21:
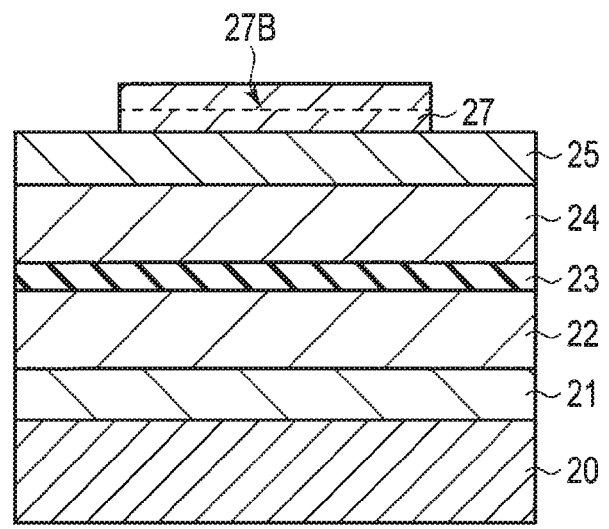

Next, as shown in FIG. 21, the resist 28 is removed. Subsequently, the hard mask 27 is processed by wet etching using the hard mask 27B as a mask. When element isolation processing is performed using the hard masks 27 and 27B, the MTJ element 100 obtains the same structure as that shown in FIG. 12. In the MTJ element 100 after the processing, the hard mask 27B has been removed, as in the third embodiment. If the hard mask 27B remains in the MTJ element 100 after the processing, it is removed by separately performing etching.

As described above, in the manufacturing method of the MTJ element 100 according to the fourth embodiment, the opening portion of the resist 28 formed by photolithography is used when implanting atoms of the additive atom film 29 into the hard mask 27. The hard masks 27 and 27B are processed into a desired shape by wet etching.

This can form a region in the hard mask 27 to which etching selectivity is imparted without implanting the atoms of the additive atom film 29 into the cap layer 25. The variation and the shape of the MTJ element 100 after the processing are more excellent than in the third embodiment. It is therefore possible to provide the MTJ element 100 that suppresses degradation of the electrical characteristic.

Note that the processing of implanting the atoms of the additive atom film 29 into the hard mask 27 may use helium (He) as the inert gas in place of neon (Ne). The same effects as described above can be obtained even by IBE in which argon (Ar) is used as the inert gas, and the DC/RF bias is adjusted to cause deceleration.

In addition, the manufacturing method of the MTJ element 100 according to the fourth embodiment is also applicable to the arrangement of the MTJ element 100 according to the first embodiment.

[5] FIFTH EMBODIMENT

In the fifth embodiment, atoms of a metal hard mask are implanted into a cap layer 25, and the cap layer 25 is used as a hard mask.

A method of manufacturing an MTJ element 100 according to the fifth embodiment will be described with reference to FIGS. 22, 23, 24, and 25. FIGS. 22, 23, 24, and 25 are sectional views showing steps in the manufacture of the MTJ element 100 according to the fifth embodiment.

Figure 22:
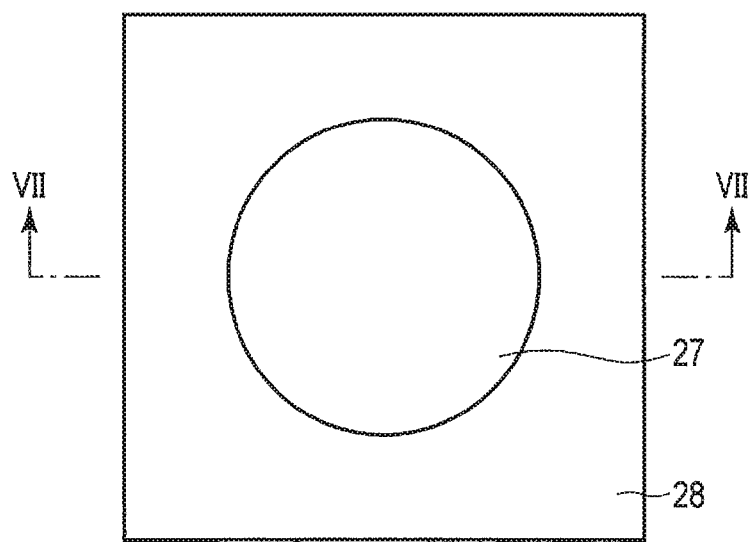
FIG. 22 is a plan view showing a process in the manufacture of an MTJ element according to the fifth embodiment.
Figure 23:
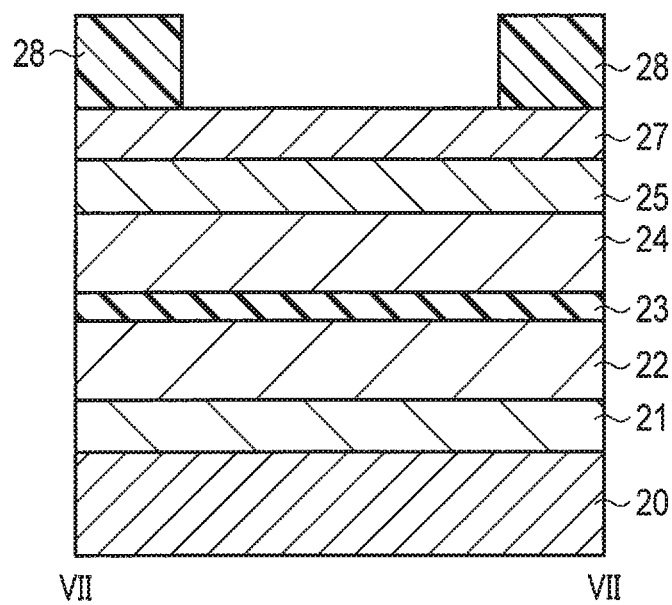
FIG. 23 is a sectional view of the MTJ element taken along a line VII-VII in FIG. 22.

First, as shown in FIGS. 22 and 23, an underlayer 21, a reference layer 22, a tunnel barrier layer 23, a storage layer 24, the cap layer 25, a hard mask 27, and a resist 28 are sequentially formed on a lower electrode 20. The resist 28 is processed into a desired pattern by photolithography. As the hard mask 27, a metal such as tantalum (Ta), titanium (Ti), tungsten (W), or molybdenum (Mo) is used.

Figure 24:
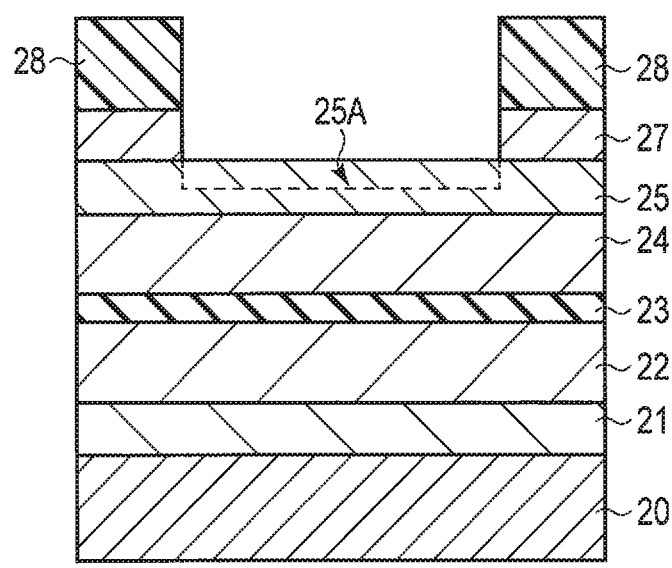
FIG. 24 and FIG. 25 are sectional view showing processes in the manufacture of the MTJ element according to the fifth embodiment, sequentially.

Next, as shown in FIG. 24, the hard mask 27 in the opening portion of the resist 28 is etched by Ne etching. Then, the atoms contained in the hard mask 27 are implanted into the cap layer 25. A region 25A of the cap layer 25 where the atoms contained in the hard mask 27 are implanted attains improved etching selectivity and can therefore be used as a hard mask when element-isolating the MTJ element 100.

Figure 25:
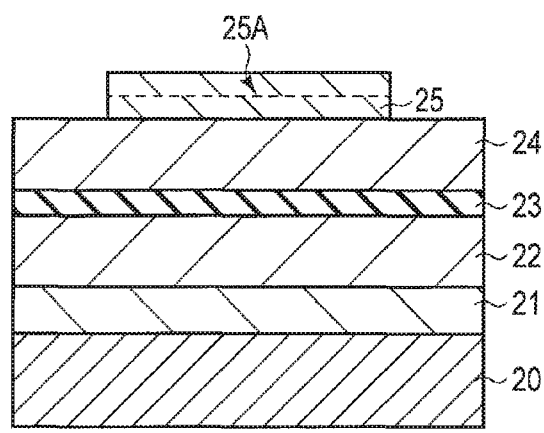

Next, as shown in FIG. 25, the resist 28 is removed. Subsequently, the cap layer 25 is processed by wet etching using the region 25A of the cap layer 25 as a mask. When element isolation processing is performed using the region 25A of the cap layer 25, the MTJ element 100 obtains the same structure as that shown in FIG. 12. Note that the region 25A of the cap layer has conductivity, and may therefore be left or removed after the element isolation processing.

As described above, in the manufacturing method of the MTJ element 100 according to the fifth embodiment, atoms of the hard mask 27 are implanted into the cap layer 25, thereby improving the selectivity of the cap layer 25. This enables processing using the cap layer 25A that is hardly etched and improves the variation and the shape of the MTJ element 100 after the processing.

Note that the processing of implanting the atoms of the hard mask 27 into the cap layer 25 may use helium (He) as the inert gas in place of neon (Ne). The same effects as described above can be obtained even by IBE in which argon (Ar) is used as the inert gas, and the DC/RF bias is adjusted to cause deceleration.

In addition, the manufacturing method of the MTJ element 100 according to the fifth embodiment is also applicable to the arrangement of the MTJ element 100 according to the first embodiment.

[6] SIXTH EMBODIMENT

In the sixth embodiment, when forming a storage layer 24, a magnetic layer having an amorphous state is formed as a thick film, and high-temperature annealing is performed, thereby forming a magnetic layer having an excellent crystalline state. After the annealing, etchback processing is performed by Ne etching, thereby obtaining desired film thickness.

Figure 26:
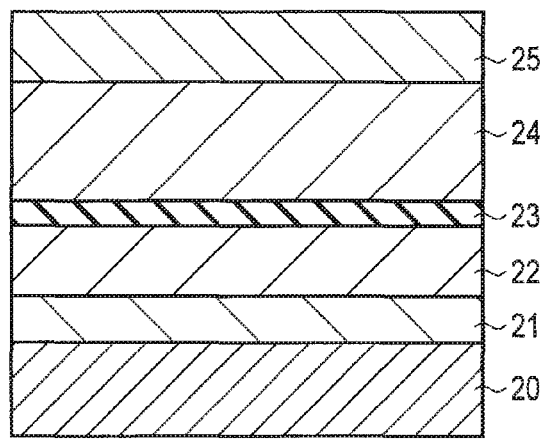
FIG. 26 and FIG. 27 are sectional view showing processes in the manufacture of the MTJ element according to the sixth embodiment, sequentially.
Figure 27:
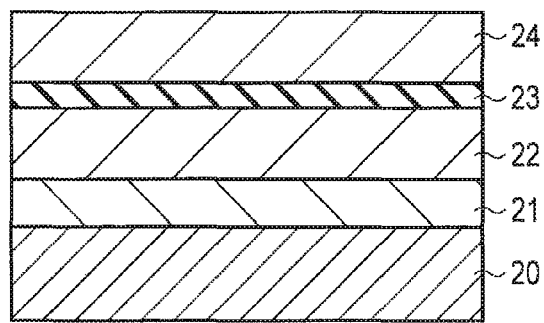

A method of manufacturing an MTJ element 100 according to the sixth embodiment will be described with reference to FIGS. 26 and 27. FIGS. 26 and 27 are sectional views showing steps in the manufacture of the MTJ element 100 according to the sixth embodiment.

First, as shown in FIG. 26, an underlayer 21, a reference layer 22, a tunnel barrier layer 23, a storage layer 24, and a cap layer 25 are sequentially formed on a lower electrode 20. The storage layer 24 is made of, for example, CoFeB in an amorphous state, and its film thickness is more than normal, for example, 30 Å. The cap layer 25 is made of, for example, tantalum (Ta), and its film thickness is more than normal, for example, 10 Å.

Next, annealing is performed at a temperature higher than normal to prompt crystallization of the magnetic layer of CoFeB or the like. The temperature used in this annealing is, for example, 450° C. or more. In a stacked structure of MgO/CoFeB, CoFeB grows in a crystal orientation state matching the MgO interface while diffusing boron (B) outward from the MgO (001) film. At this time, since the CoFeB layer is thick, diffusion of a metal such as Ta that forms the cap layer 25 to the vicinity of the interface of the tunnel barrier layer 23 is suppressed.

Next, as shown in FIG. 27, the storage layer 24 and the cap layer 25 are etched back by Ne etching to make the storage layer 24 have a desired film thickness. The same manufacturing method as in the first to fifth embodiments is applicable to the subsequent processes.

In sputter etching used for etchback processing, a rare gas such as argon (Ar) is normally used. In the sputter etching using Ar, however, the constituent atoms of the cap layer 25 may be implanted into the lower magnetic film by Ar particles.

To prevent this, etchback processing is performed by etching using neon gas as an inert gas. This makes it possible to suppress implantation of the atoms of the cap layer 25 into the magnetic layer at the time of etchback processing of the magnetic layer and form a magnetic film with excellent crystallinity without degradation of the interface. This processing also has the advantage of planarizing the magnetic film of CoFeB or the like by Ne ions.

Figure 28A:
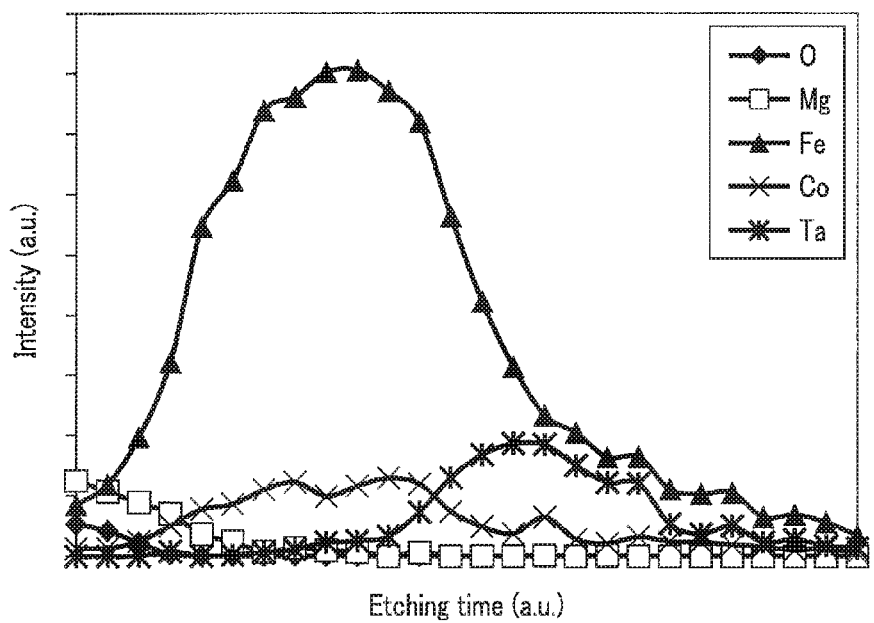
FIGS. 28A and 28B are profiles showing the effect of the processes in the manufacture of the MTJ element according to the sixth embodiment.
Figure 28B:
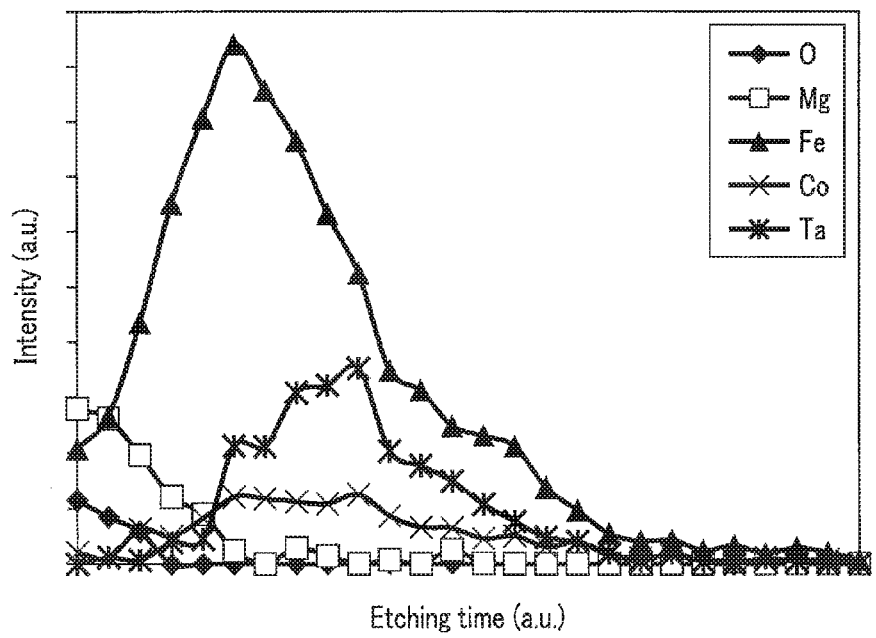

Implantation of a metal into a magnetic layer by Ne etching will be described with reference to FIGS. 28A and 28B. FIGS. 28A and 28B show experimental results obtained by performing Ne etching for a structure in which Ta serving as a cap layer is stacked on a magnetic layer made of CoFeB as profiles obtained by performing energy dispersive X-ray spectroscopy (EDX) for a section of the structure.

The ordinate of each of FIGS. 28A and 28B corresponds to the intensity, and the abscissa corresponds to a position in the thickness direction. The abscissa of each of FIGS. 28A and 28B corresponds to the lower layer to the upper layer from left to right. FIG. 28A shows the profile of a structure obtained by performing Ne etching for the surface of a CoFeB layer, and FIG. 28B shows the profile of a structure obtained by performing Ne etching halfway through the CoFeB layer.

As shown in FIGS. 28A and 28B, Ta of the cap layer is implanted into the CoFeB layer by Ne etching. The depth to implant Ta is suppressed to the vicinity of the MgO layer corresponding to the tunnel barrier layer even in a case in which CoFeB is etched halfway. Ne etching is superior in controlling the implantation depth because of the weak implantation effect.

As described above, in the sixth embodiment, etchback processing by Ne etching is performed for the storage layer 24 and the cap layer 25, which are formed thick. This can form a magnetic layer in an excellent crystalline state and manufacture the MTJ element 100 with an improved MR ratio and interface perpendicular magnetic anisotropy.

Note that the manufacturing method of the MTJ element 100 according to the sixth embodiment is also applicable to a magnetic layer other than the storage layer 24.

Additionally, in the sixth embodiment, the MTJ element 100 has a top free structure in which the storage layer 24 is stacked above the reference layer 22. However, the structure is not limited to this, and a bottom free structure in which the positions of the reference layer 22 and the storage layer 24 are replaced may be employed.

[7] SEVENTH EMBODIMENT

In the seventh embodiment, a magnetic layer is formed in a crystalline state with a little amount of impurity and then amorphized by Ne etching, thereby controlling the orientation of an MTJ element 100.

A method of manufacturing an MTJ element 100 according to the seventh embodiment will be described with reference to FIGS. 29, 30, 31, 32, and 33. FIGS. 29, 30, 31, 32, and 33 are sectional views showing steps in the manufacture of the MTJ element 100 according to the seventh embodiment.

First, as shown in FIG. 29, an underlayer 21 and a reference layer 22 are sequentially formed on a lower electrode 20. Next, Ne etching is performed for a reference layer 22. The reference layer 22 is made of, for example, CoFe and has a crystalline state. The reference layer 22 in the crystalline state will be referred to as the reference layer 22A.

As shown in FIG. 30, when Ne etching is performed for the reference layer 22A, the reference layer 22A is doped with Ne and amorphized. The reference layer 22 in the amorphous state will be referred to as a reference layer 22B.

In this embodiment, the reference layer 22 is doped with Ne at $1\times10^{14}$ cm$^{-2}$ by a pull-in voltage of, for example, 1 KV and amorphized.

Next, as shown in FIG. 31, a tunnel barrier layer 23 and a storage layer 24 are sequentially formed on the reference layer 22. Subsequently, Ne etching is performed for a storage layer 24. The storage layer 24 is made of, for example, CoFe and has a crystalline state. The storage layer 24 in the crystalline state will be referred to as the storage layer 24A.

Figure 32:
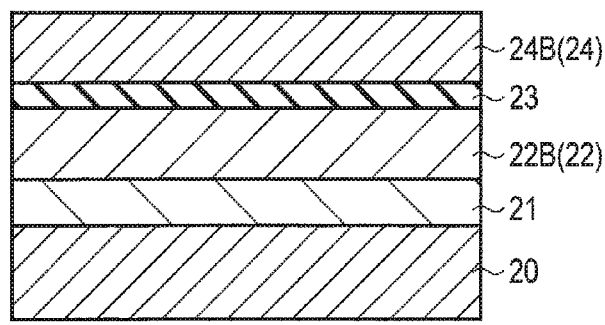

As shown in FIG. 32, when Ne etching is performed for the storage layer 24A, the storage layer 24A is doped with Ne and amorphized. The storage layer 24 in the amorphous state will be referred to as a storage layer 24B. In this embodiment, the storage layer 24 is doped with Ne at $1\times10^{14}$ cm$^{-2}$ by a pull-in voltage of, for example, 1 KV and amorphized.

Figure 33:
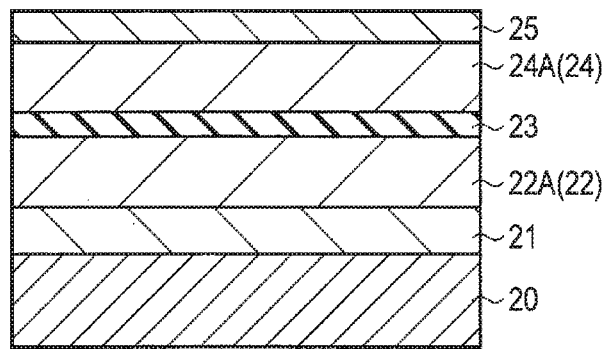

Next, as shown in FIG. 33, a cap layer 25 is formed on the storage layer 24, and high-temperature annealing is performed, thereby crystallizing the reference layer 22 and the storage layer 24. The annealing for crystallizing the reference layer 22 and the storage layer 24 is performed, for example, in vacuum at 360° C. for 1 hr. With this annealing, MgO in the tunnel barrier layer 23 is crystallized, and CoFe in the reference layer 22 and the storage layer 24 is also crystallized. The same manufacturing method as in the first to sixth embodiments is applicable to the subsequent processes.

In the MTJ element formed from a stacked layer of metal magnetic film/insulating film/metal magnetic film, the orientation needs to be controlled to obtain a high MR ratio. In a case in which CoFe is used as the metal magnetic films (storage layer 24 and reference layer 22), and MgO is used as the insulating film (tunnel barrier layer 23), it is necessary to form CoFe/MgO/CoFe whose orientation is controlled to (100). The MR ratio increases when CoFe and MgO match in the (100) plane direction, and the crystallinity of CoFe becomes high.

However, CoFe has a (110) preferred orientation. If films are deposited in the order of CoFe/MgO/CoFe, CoFe(110)/MgO(100)/CoFe(110) is formed, and the MTJ element 100 with plane matching cannot be formed.

In a manufacturing method of an MTJ element according to a comparative example, first, CoFeB/MgO/CoFeB is formed using CoFeB in an amorphous state in place of CoFe. Out diffusion of B is caused by annealing, and CoFe is crystallized using MgO as a seed. CoFe/MgO/CoFe with matching in the (100) plane direction can thus be formed. As an out diffusion method of B, Ta layers are provided on and under CoFeB/MgO/CoFeB, and Ta is caused to absorb B. The higher the annealing temperature is, the lower the B concentration in CoFe is.

However, when annealing is performed in out diffusion of B, diffusion of Ta in CoFe also progress at the same time as the absorption of B by Ta. Hence, if CoFeB is used as the metal magnetic film, the concentrations of impurities such as B and Ta in the metal magnetic film cannot be reduced, and the MR ratio cannot be improved.

In the manufacturing method of the MTJ element 100 according to the seventh embodiment, ion implantation is used as a method of forming CoFe in the amorphous state. More specifically, when stacking CoFe/MgO/CoFe as the MTJ element 100, the lower and upper CoFe films are deposited and then exposed to an inert gas (for example, Ne plasma) to amorphize CoFe. The amorphized CoFe is crystallized by annealing using MgO as a seed.

With the manufacturing method of the MTJ element 100 according to the seventh embodiment, a CoFe/MgO/CoFe structure with a (100) orientation can thus be obtained. Since amorphous CoFe with a low impurity concentration can be obtained without adding B, the MTJ element 100 having an excellent crystalline state and excellent electrical characteristic can be provided.

Note that in this embodiment, Ne is used as the doping gas for amorphizing CoFe. Even in a case in which an inert gas such as He, Ar, or Kr is used, the same effect as Ne can be obtained by appropriately adjusting the doping amount by the pull-in voltage. The same effect can also be obtained by ion-implanting Co or Fe into the CoFe layer.

In this embodiment, CoFe that does not contain B is used as the storage layer 24 and the reference layer 22. However, the material is not limited to this, and CoFeB with a low B content may be used.

Additionally, in the seventh embodiment, the MTJ element 100 has a top free structure in which the storage layer 24 is stacked above the reference layer 22. However, the structure is not limited to this, and a bottom free structure in which the positions of the reference layer 22 and the storage layer 24 are replaced may be employed.

[8] EIGHTH EMBODIMENT

In the eighth embodiment, a metal is doped into a region on the opposite side of the contact to a tunnel barrier layer 23 in each of a reference layer 22 and a storage layer 24.

Figure 34:
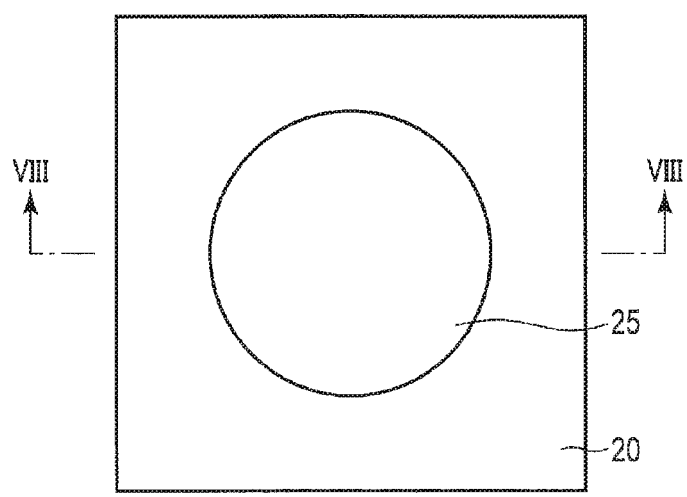
FIG. 34 is a plan view showing a process in the manufacture of an MTJ element according to the eighth embodiment.
Figure 35:
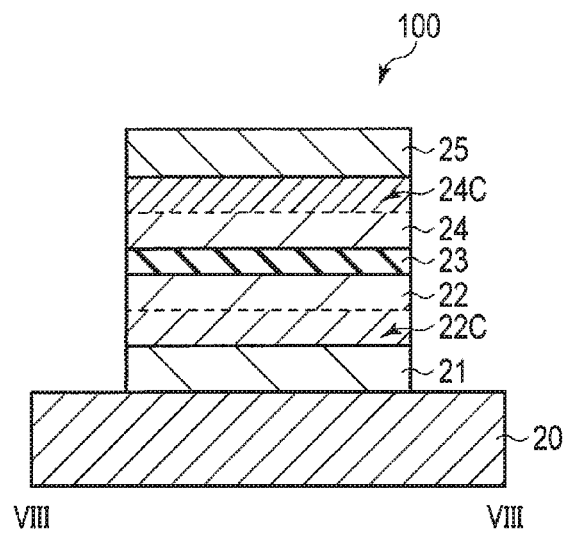
FIG. 35 is a sectional view of the MTJ element taken along a line VIII-VIII in FIG. 34.

The structure of an MTJ element 100 according to the eighth embodiment will be described with reference to FIGS. 34 and 35. FIG. 34 is a plan view showing the MTJ element 100 according to the eighth embodiment. FIG. 35 is a sectional view of the MTJ element 100 taken along a line VIII-VIII in FIG. 34.

The MTJ element 100 has a structure in which an underlayer 21, a bulk reference layer 22C, the reference layer 22, the tunnel barrier layer 23, the storage layer 24, a bulk storage layer 24C, and a cap layer 25 are sequentially stacked on a lower electrode 20.

The bulk reference layer 22C and the bulk storage layer 24C are formed by doping a metal into the reference layer 22 and the storage layer 24, and have an amorphous state. In the bulk reference layer 22C and the bulk storage layer 24C, a metal such as Ta or Mo is doped by 1% or more. The rest of the arrangement is the same as in the first to seventh embodiments.

A method of manufacturing the MTJ element 100 according to the eighth embodiment will be described with reference to FIGS. 36, 37, 38, and 39. FIGS. 36, 37, 38, and 39 are sectional views showing steps in the manufacture of the MTJ element 100 according to the eighth embodiment.

Figure 36:
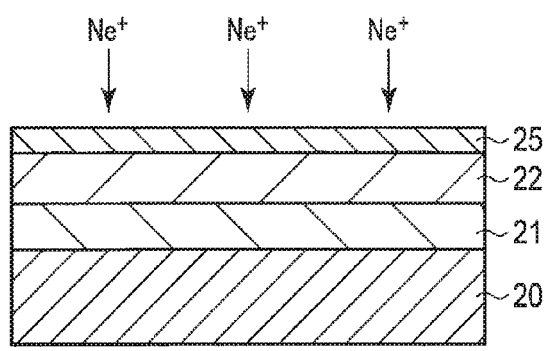

First, as shown in FIG. 36, the underlayer 21, the reference layer 22, and the cap layer 25 are sequentially formed on the lower electrode 20. Next, Ne etching is performed for the cap layer 25 and part of the reference layer 22. The reference layer 22 is made of, for example, CoFeB. The cap layer 25 is made of a metal such as Ta or Mo.

Figure 37:
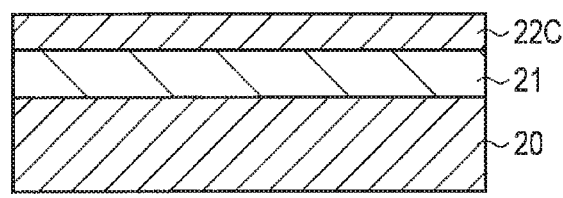

As shown in FIG. 37, when Ne etching is performed, the reference layer 22 is doped with the atoms of the cap layer 25 and changes to an amorphous state. The reference layer 22 doped with the atoms of the cap layer 25 will be referred to as the bulk reference layer 22C.

Next, as shown in FIG. 38, the reference layer 22, the tunnel barrier layer 23, the storage layer 24, and the cap layer 25 are sequentially formed. Next, Ne etching is performed for the cap layer 25 and part of the storage layer 24. The storage layer 24 is made of, for example, CoFeB.

As shown in FIG. 39, when Ne etching is performed, the storage layer 24 is doped with the atoms of the cap layer 25 and partially changes to an amorphous state. The storage layer 24 doped with the atoms of the cap layer 25 will be referred to as bulk storage layer 24C.

The same manufacturing method as in the first to seventh embodiments is applicable to the processes subsequent to forming the cap layer 25 on the storage layer 24. Note that the bulk reference layer 22C and the bulk storage layer 24C maintain the amorphous state even if an annealing process of crystallizing the reference layer 22 and the storage layer 24 is performed.

In an MRAM, to implement a microcell, a high MR ratio, perpendicular magnetic anisotropy, suppression of a leakage magnetic field of the reference layer, and a low profile to facilitate processing are necessary as the characteristics of the MTJ element. For the high MR ratio and perpendicular magnetic anisotropy, crystal matching of ferromagnetic layers on the interface of the tunnel barrier layer is important. For suppression of a leakage magnetic field of the reference layer and processing facilitation, it is necessary to lower the magnetization (lower the Ms) of the ferromagnetic layers.

To improve both, a metal such as Ta or Mo is doped into CoFeB ferromagnetic layers (storage layer 24 and reference layer 22). More specifically, the ferromagnetic layers are formed with a concentration distribution of a metal such as Ta or Mo. The interface portions of the storage layer 24 and the reference layer 22 with respect to the tunnel barrier layer 23 are ferromagnetic layers with a low Ms mainly containing the ferromagnetic component. On the other hand, the bulk storage layer 24C and the bulk reference layer 22C doped with the metal are spaced part from the interfaces of the tunnel barrier layer 23. Metal doping in each ferromagnetic layer is performed by etching the cap layer 25 made of Ta, Mo, or the like by ions of Ne or the like.

Each of the reference layer 22 and the storage layer 24 can attain a high MR ratio because of the main components of CoFeB in the vicinity of the interface of the tunnel barrier layer 23, and can obtain high perpendicular magnetic anisotropy. The bulk reference layer 22C can attain a low MS and reduce the leakage magnetic field by doping of Ta or Mo. The bulk storage layer 24C can reduce the write current.

In the above-described way, the MTJ element 100 according to the eighth embodiment can lower the Ms of the ferromagnetic films without lowering the MR ratio.

Note that in the eighth embodiment, the MTJ element 100 has a top free structure in which the storage layer 24 is stacked above the reference layer 22. However, the structure is not limited to this, and a bottom free structure in which the positions of the reference layer 22 and the storage layer 24 are replaced may be employed.

[9] NINTH EMBODIMENT

In the ninth embodiment, when manufacturing an MTJ element 100 using an SAF structure, Ne etching is performed for the surface of a coupling layer, thereby improving planarity.

Figure 41:
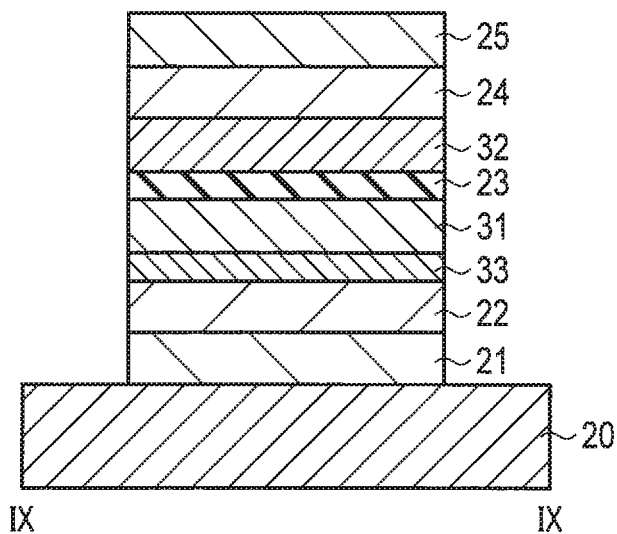
FIG. 41 is a sectional view of the MTJ element taken along a line IX-IX in FIG. 40.

The structure of the MTJ element 100 according to the ninth embodiment will be described with reference to FIGS. 40 and 41. FIGS. 40 and 41 are plan and sectional views, respectively, showing the MTJ element 100 according to the ninth embodiment.

The MTJ element 100 has a structure in which an underlayer 21, a reference layer 22, a nonmagnetic layer (coupling layer) 33, an interface magnetic layer (high-orientation magnetic reference layer) 31, a tunnel barrier layer 23, an interface magnetic layer (high-orientation magnetic storage layer) 32, a storage layer 24, and a cap layer 25 are sequentially stacked on a lower electrode 20.

The MTJ element 100 includes the coupling layer 33 and is formed into an SAF (Synthetic AntiFerromagnetic) structure. As the coupling layer 33, for example, ruthenium (Ru) is used. The magnetization directions of the interface magnetic layer 31 and the reference layer 22 are set to be antiparallel using antiferromagnetic coupling by ruthenium. The coupling layer has a film thickness of, for example, about 4 Å and a coupling magnetic field of, for example, 5 to 8 kOe. The interface magnetic layers 31 and 32 are made of a material having a high polarization ratio. For example, CoFeB is used.

Figure 42:
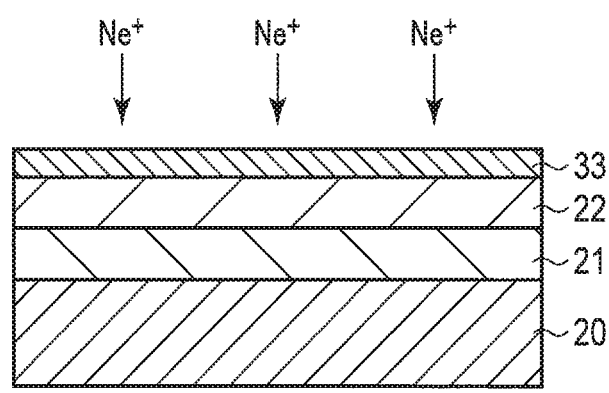
FIG. 42 and FIG. 43 are sectional view showing processes in the manufacture of the MTJ element according to the ninth embodiment, sequentially.
Figure 43:
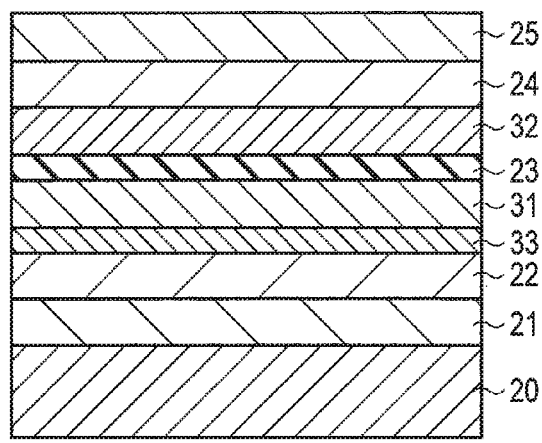

A method of manufacturing the MTJ element 100 according to the ninth embodiment will be described with reference to FIGS. 42 and 43. FIGS. 42 and 43 are sectional views showing steps in the manufacture of the MTJ element 100 according to the ninth embodiment.

First, as shown in FIG. 42, the underlayer 21, the reference layer 22, and the coupling layer 33 are sequentially formed on the lower electrode 20. The coupling layer 33 is formed using, for example, sputtering. The film thickness of the coupling layer 33 is, for example, 15 nm. Next, etching (Ne etching) using neon gas as an inert gas is performed for the surface of the coupling layer 33. The film thickness of the etched coupling layer 33 is, for example, 6 nm. The surface of the coupling layer 33 is thus planarized, and the crystallinity of the interface magnetic layer 32 to be formed on it improves. Note that the film thickness of the coupling layer 33 can be adjusted on the order of 1 nm or less by the magnetic characteristic.

Next, as shown in FIG. 43, the tunnel barrier layer 23, the interface magnetic layer 32, the storage layer 24, and the cap layer 25 are sequentially formed. The same manufacturing method as in the first to eighth embodiments is applicable to the subsequent processes.

As described above, in the manufacturing method of the MTJ element 100 according to the ninth embodiment, etching using Ne as the inert gas is performed after deposition of the coupling layer 33.

An MTJ element formed from a stacked layer of metal magnetic film/insulating film/metal magnetic film uses a shift adjustment layer to cancel the influence of a leakage magnetic field and the magnetization difference between a reference layer and a storage layer. However, since the shift adjustment layer is distant from the metal magnetic film/insulating film/metal magnetic film and therefore needs a large magnetization, the MTJ element becomes thick, resulting difficulty in microfabrication. When an SAF structure using Ru or the like as a coupling layer is formed, the film thickness of the MTJ element can be decreased.

However, if the planarity of Ru of the coupling layer is poor, the magnetization directions of the magnetic films that sandwich the coupling layer are not parallel, and magnetic anisotropy may become small. When the magnetic anisotropy becomes small, retention degrades.

To prevent this, in the manufacturing method of the MTJ element 100 according to the ninth embodiment, Ne etching is performed for the metal film of Ru or the like that constitutes the coupling layer 33. In the Ne etching, processing progresses while performing etching and readhesion near the surface of the coupling layer 33. This improves the planarity of the surface of the coupling layer 33.

Figures 44A, 44B:
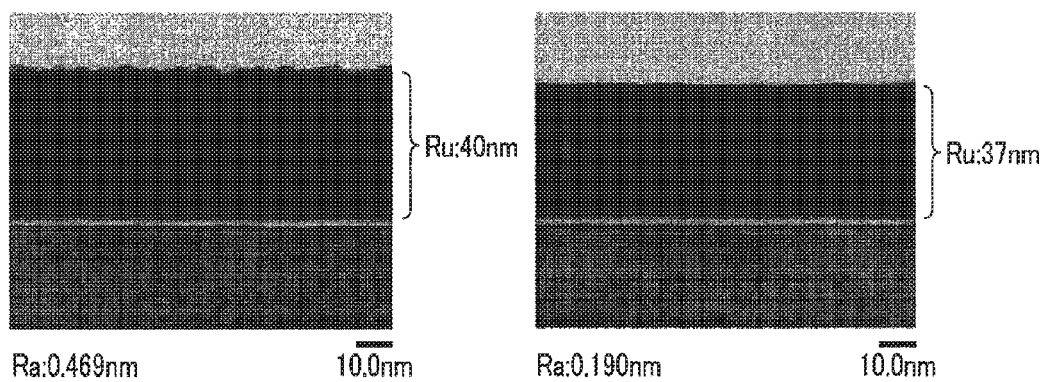
FIGS. 44A and 44B are sectional views showing the effect of the processes in the manufacture of the MTJ element according to the ninth embodiment.

The effect of the manufacturing method of the MTJ element 100 according to the ninth embodiment will be described with reference to FIGS. 44A and 44B. FIGS. 44A and 44B are sectional views showing an experimental result of the steps in the manufacture of the MTJ element 100 according to the ninth embodiment. FIG. 44A shows a structure in which ruthenium used for the coupling layer 33 is deposited to 40 nm on the underlayer, and FIG. 44B shows a structure after Ne etching is performed for the substrate shown in FIG. 44A.

As shown in FIG. 44A, the Ru layer after deposition has a film thickness of 40 nm and a surface roughness Ra of 0.469 nm. On the other hand, as shown in FIG. 44B, the Ru layer after Ne etching has a film thickness of 37 nm and the surface roughness Ra of 0.190 nm. The Ru layer after Ne etching has an improved surface roughness as compared to the Ru layer before Ne etching.

As described above, the manufacturing method of the MTJ element 100 according to the ninth embodiment can improve the planarity of the coupling layer 33. When the planarity of the coupling layer 33 improves, it is possible to maintain the parallelism of the magnetization directions of the magnetic films that sandwich the coupling layer 33 and form an SAF structure having high magnetic anisotropy. It is also possible to reduce the variation in the magnetic films that are in contact via the coupling layer 33.

Note that in this embodiment, Ne is used as the doping gas for amorphizing CoFe. Even in a case in which an inert gas such as He, Ar, or Kr is used, the same effect as Ne can be obtained by appropriately adjusting the pull-in voltage.

Additionally, in the ninth embodiment, the MTJ element 100 has a top free structure in which the storage layer 24 is stacked above the reference layer 22. However, the structure is not limited to this, and a bottom free structure in which the positions of the reference layer 22 and the storage layer 24 are replaced may be employed.

[10] ARRANGEMENT EXAMPLES

Arrangement examples of MRAMs in a case in which MTJ elements 100 according to the first to ninth embodiments are used will be described below. Arrangement Example 1 is an MRAM using the MTJ element 100 without a side wall on the side surface of a storage layer 24. Arrangement Example 2 is an MRAM using the MTJ element 100 with a side wall provided on the side surface of the storage layer 24.

[10-1] Arrangement Example 1

An MRAM according to Arrangement Example 1 will be described with reference to FIGS. 45, 46, 47, and 48. FIGS. 45, 46, 47, and 48 are sectional views showing steps in the manufacture of the MRAM according to Arrangement Example 1.

Figure 45:
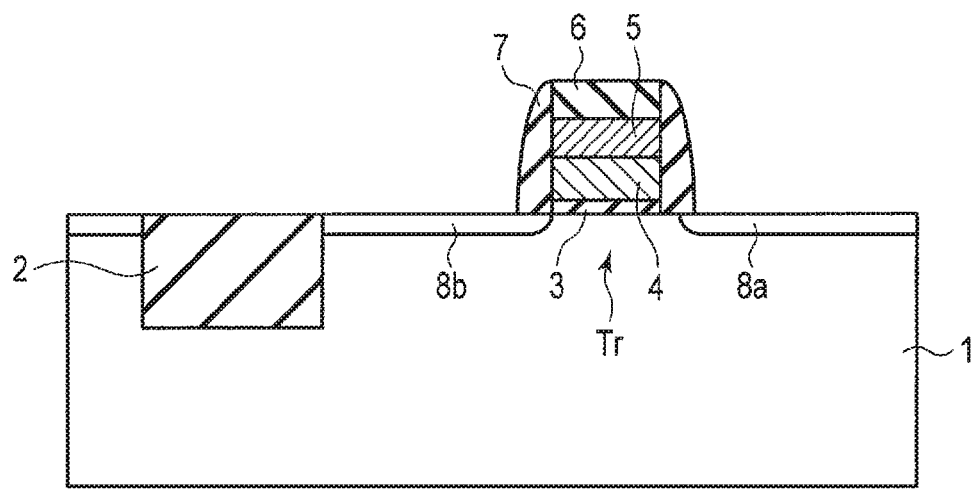

First, as shown in FIG. 45, a trench for element isolation is formed in a region other than a transistor active region on the surface of a semiconductor substrate 1, and for example, a $SiO_2$ film is buried in the trench. An element isolation region 2 having a shallow trench isolation (STI) structure is thus formed.

Next, a transistor Tr used to perform a switch operation is formed in the following way. An oxide film 3 having a thickness of about 60 Å is formed on the semiconductor substrate 1 by thermal oxidation. An $n^+$-type polysilicon film 4 doped with, for example, arsenic is formed on the surface of the semiconductor substrate 1. A WSix film 5 and a nitride film 6 are sequentially formed on the polysilicon film 4. After that, the polysilicon film 4, the WSix film 5, and the nitride film 6 are processed by normal photolithography and reactive ion etching), thereby forming a gate electrode. A nitride film 7 is deposited on the gate electrode. After that, a spacer portion formed from the nitride film 7 is provided on the side walls of the gate electrode using a side wall leaving method by RIE. Next, source/drain regions 8a and 8b are formed in the surface of the semiconductor substrate 1 by ion implantation and annealing, although details of the process will be omitted. The select transistor Tr functioning as the switching element of a memory cell is thus formed.

Figure 46:
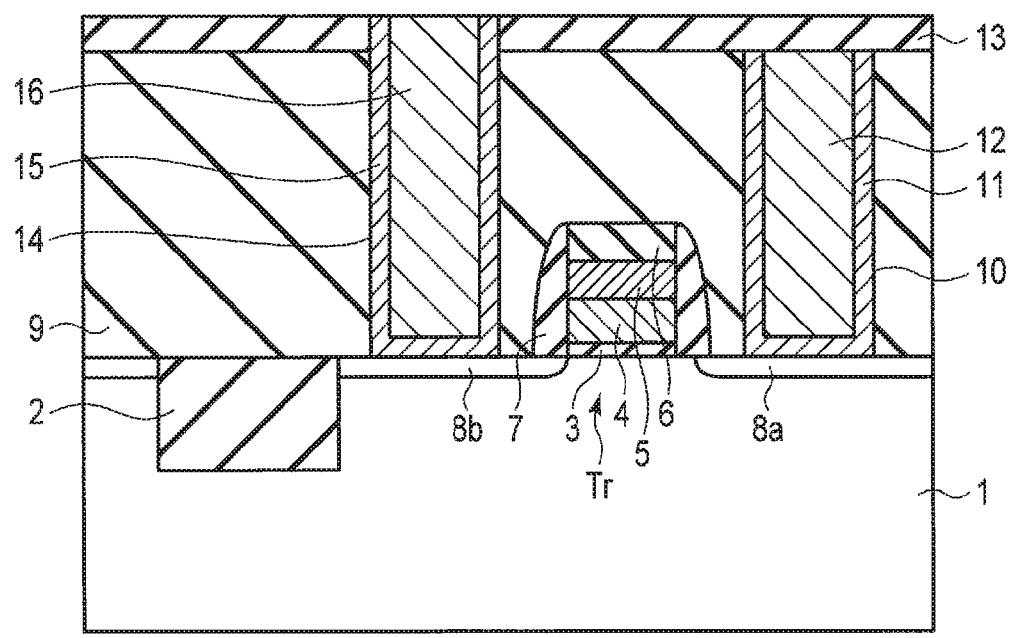

As shown in FIG. 46, after a CVD oxide film 9 is deposited on the transistor Tr, planarization is performed by chemical mechanical polishing (CMP). A contact hole 10 communicating with the source/drain region 8a is formed in the CVD oxide film 9. After that, a thin titanium film is deposited in the contact hole 10 by sputtering or CVD and annealed in a forming gas, thereby forming a TiN film 11. Next, CVD tungsten is deposited on the TiN film 11. The tungsten and the TiN film 11 which exist outside the contact hole 10 are removed by CMP. The tungsten is thus buried in the contact hole 10, thereby forming a contact 12. After that, a CVD nitride film 13 is deposited on the CVD oxide film 9 and the contact 12. A contact hole 14 communicating with the other source/drain region 8b is formed. A TiN film 15 and tungsten are buried in the contact hole 14, thereby forming a contact 16, like formation of the contact 12. The contact 16 corresponds to the lower electrode 20 described in the embodiments.

Figure 47:
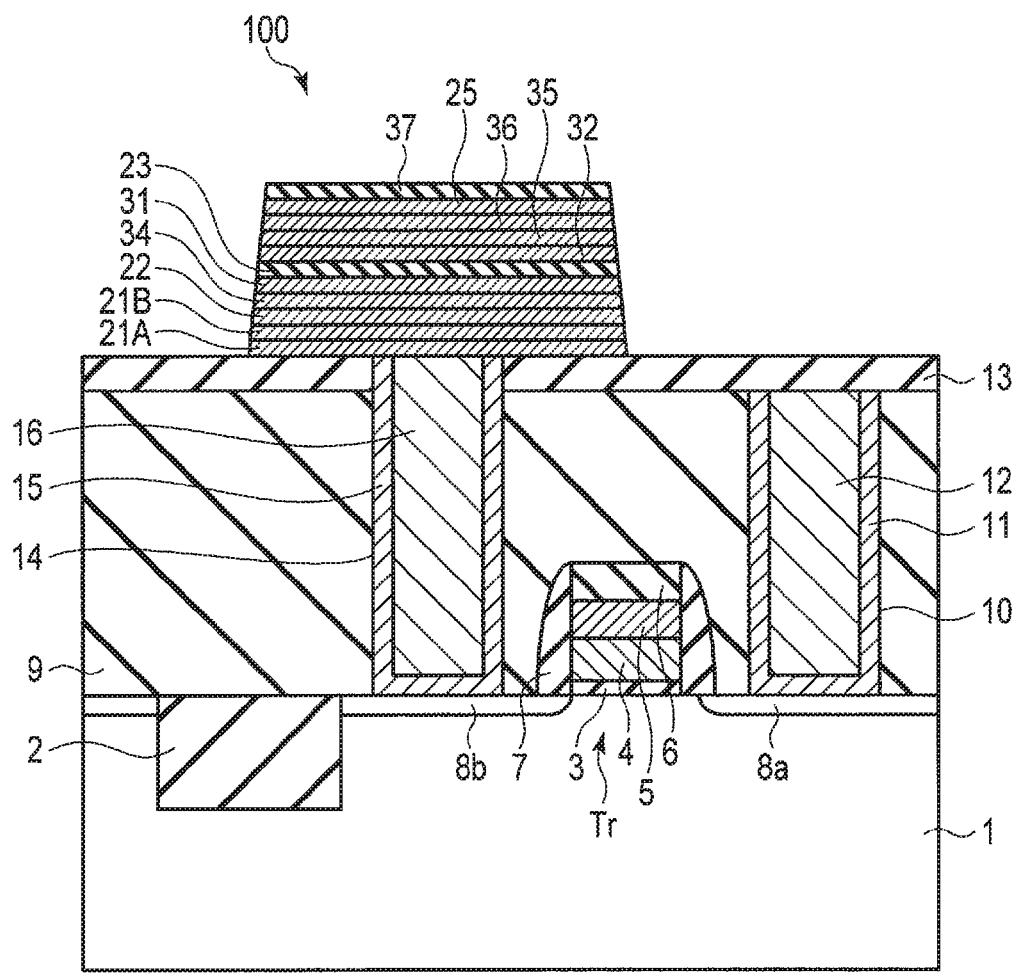

Next, as shown in FIG. 47, a lower electrode 21A of the MTJ element 100 is formed on the contact 16 and the CVD nitride film 13. The lower electrode 21A is made of, for example, Ta having a film thickness of 5 nm.

An orientation control film 21B is formed on the lower electrode 21A. The orientation control film 21B is made of, for example, Pt having a film thickness of 5 nm, and has a (001) plane orientation.

A reference layer 22 is formed on the orientation control film 21B. The reference layer 22 is made of, for example, $Fe_{50}Pt_{50}$ having a film thickness of 10 nm.

A diffusion prevention layer 34 is formed on the reference layer 22. The diffusion prevention layer 34 is made of, for example, Ta having a film thickness of 0.5 nm.

A high-orientation magnetic reference layer 31 is formed on the diffusion prevention layer 34. The high-orientation magnetic reference layer 31 is made of, for example, $Co_{40}Fe_{40}B_{20}$ having a film thickness of 1 nm.

A tunnel barrier layer 23 is formed on the high-orientation magnetic reference layer 31. The tunnel barrier layer 23 is made of MgO having a film thickness of, for example, 1 nm.

A high-orientation magnetic storage layer 32 is formed on the tunnel barrier layer 23. The high-orientation magnetic storage layer 32 is made of, for example, $Co_{40}Fe_{40}B_{20}$ having a film thickness of 1 nm.

Annealing for crystallizing the tunnel barrier layer 23, the high-orientation magnetic reference layer 31, and the high-orientation magnetic storage layer 32 is performed, for example, in vacuum at 360° C. for 1 hr. With this annealing, MgO is crystallized. CoFeB films in the high-orientation magnetic reference layer 31 and the high-orientation magnetic storage layer 32 are also crystallized. In addition, B is removed from the films, and they change to $Co_{50}Fe_{50}$ films.

Next, a diffusion prevention layer 35 is formed on the high-orientation magnetic storage layer 32. The diffusion prevention layer 35 is made of, for example, Ta having a film thickness of 0.5 nm.

A shift adjustment layer 36 is formed on the diffusion prevention layer 35. The shift adjustment layer 36 is made of, for example, a stacked film [Co/Pd] 20 obtained by stacking Co having a film thickness of 0.4 nm and Pd having a film thickness of 0.8 nm for 20 cycles.

A cap layer 25 is formed on the shift adjustment layer 36. The cap layer 25 is made of, for example, Ta having a film thickness of 10 nm.

In the above steps, the lower electrode 21A, the orientation control film 21B, the reference layer 22, the diffusion prevention layer 34, the high-orientation magnetic reference layer 31, the tunnel barrier layer 23, the high-orientation magnetic storage layer 32, the diffusion prevention layer 35, the shift adjustment layer 36, and the cap layer 25 are formed using, for example, sputtering.

Next, a CVD oxide film 37 serving as a process mask material is deposited on the cap layer 25. After that, the CVD oxide film 37 is patterned by photolithography and RIE, and a photoresist (not shown) used for this is removed.

The cap layer 25, the shift adjustment layer 36, the diffusion prevention layer 35, the high-orientation magnetic storage layer 32, the tunnel barrier layer 23, the high-orientation magnetic reference layer 31, the diffusion prevention layer 34, the reference layer 22, the orientation control film 21B, and the lower electrode 21A are etched using RIE. Processing of the MTJ element 100 is thus completed.

Next, as shown in FIG. 48, an antioxidation protective film 40 is formed by CVD so as to cover the MTJ element 100. The antioxidation protective film 40 is made of, for example, an SiN film having a film thickness of 5 nm. An interlayer dielectric film 41 made of an $SiO_2$ film is formed on the antioxidation protective film 40 and the CVD nitride film 13 by CVD. As the formation conditions of the $SiO_2$ film, TEOS and $O_2$ are used as row materials, an RF plasma is applied at a substrate temperature of 350° C. This protective film is used for the purpose of suppressing damage degradation such as oxidation of the MTJ element exposed to an atmosphere containing hydrogen and oxygen generated when forming an interlayer dielectric film to be formed on it.

A contact 42 connected to the cap layer 25 and a contact 43 connected to the contact 12 are formed simultaneously. As for formation of the contacts 42 and 43, contact holes are formed and then filled with W using a TiN barrier layer. The TiN barrier layer is formed by CVD at a deposition temperature of 350° C. using $TiCl_4$ and $NH_3$ as source gases. W is deposited by CVD using $WF_6$ as a source gas. After planarization by CMP, an oxide film 44 is deposited on the contacts 42 and 43 and the interlayer dielectric film 41. Trenches are formed in the oxide film 44 using photolithography and RIE. Al is buried in the trenches and planarized by CMP, thereby forming first interconnections 45 and 46 connected to the contacts 42 and 43, respectively. Subsequently, an interlayer film 47 is deposited on the first interconnections 45 and 46 and the oxide film 44, and a via hole is formed in the interlayer film 47 by photolithography and RIE. Al is buried in the via hole and planarized by CMP, thereby forming a via 48 connected to the first interconnection 46. Furthermore, an interlayer film 49 is deposited on the via 48 and the interlayer film 47, and a trench for a second interconnection is formed by photolithography and RIE. Al is buried in the trench and planarized by CMP, thereby forming a second interconnection 50 connected to the via 48. After that, although not illustrated, an upper interconnection layer is sequentially formed, and a magnetic random access memory is thus completed.

Note that the stacking order of the layers included in the MTJ element 100 may be reversed. In this case, the MTJ element 100 has, for example, the following stacked structure. The lower electrode 21A made of Ta having a film thickness of 5 nm is formed. Next, the orientation control film 21B made of Pt having a film thickness of 5 nm is formed. The orientation control film 21B has a (001) plane orientation. The storage layer 24 made of a stacked film [Co/Pt] 5 obtained by stacking Co having a film thickness of 0.4 nm and Pt having a film thickness of 0.8 nm for five cycles is formed. Ta having a film thickness of 0.5 nm is formed as the diffusion prevention layer 35. The high-orientation magnetic storage layer 32 made of $Co_{40}Fe_{40}B_{20}$ having a film thickness of 1 nm is formed. The tunnel barrier layer 23 made of MgO having a film thickness of 1 nm is formed. The high-orientation magnetic reference layer 31 made of $Co_{40}Fe_{40}B_{20}$ having a film thickness of 1 nm is formed. Ta having a film thickness of 0.5 nm is formed as the diffusion prevention layer 34. The reference layer 22 made of $Fe_{50}Pt_{50}$ having a film thickness of 10 nm is formed. The cap layer 25 made of Ta having a film thickness of 10 nm is formed.

As the reference layer 22, a perpendicular magnetization film made of not $Fe_{50}Pt_{50}$ described above but $Co_{50}Pt_{50}$, $Co_{30}Fe_{20}Pt_{50}$, or the like may be used. As the reference layer 22, $(Fe_{50}Pt_{50})_{88}$—$(SiO_2)_{12}$ or the like, which is a structure obtained by dividing the film by $SiO_2$, MgO, or the like, may be used. As the storage layer 24, not a Co/Pt artificial lattice but a Co/Pd artificial lattice may be used. The number of stacking cycles can be changed within the range of 1 to 10 in accordance with the characteristic. An alloy of Co and Pt is also usable. Pt is used as the orientation control film 21B. However, Ir or Ru or a stacked film thereof may be used.

To fix the reference layer 22 to one direction, an antiferromagnetic layer may adjacently be provided. As the antiferromagnetic layer, for example, an alloy of Mn and Fe, Ni, Pt, Pd, Ru, Os, or Ir, that is, FeMn, NiMn, PtMn, PtPdMn, RuMn, OsMn, IrMn, CrPtMn, or the like is used.

[10-2] Arrangement Example 2

An MRAM according to Arrangement Example 2 will be described with reference to FIGS. 49 and 50. FIGS. 49 and 50 are sectional views showing steps in the manufacture of the MRAM according to Arrangement Example 2. Arrangement Example 2 is different from Arrangement Example 1 only in the portion of the MTJ element 100, and a description of common portions will be omitted.

As shown in FIG. 49, the processes up to formation of the cap layer 25 are the same as in Arrangement Example 1.

Next, a hard mask 27 (not shown) is formed on the upper electrode, and a protective film 26 of the MTJ element 100 is formed by the method of the first embodiment. At this time, the tunnel barrier layer 23 has partially been amorphized.

The CVD oxide film 37 serving as a process mask material is deposited on the cap layer 25. After that, the CVD oxide film 37 is patterned by photolithography and RIE, and a photoresist (not shown) used for this is removed.

The cap layer 25, the shift adjustment layer 36, the diffusion prevention layer 35, the high-orientation magnetic storage layer 32, the tunnel barrier layer 23, the high-orientation magnetic reference layer 31, the diffusion prevention layer 34, the reference layer 22, the orientation control film 21B, and the lower electrode 21A are etched using RIE. Processing of the MTJ element 100 is thus completed. The rest of the steps and arrangement is the same as in Arrangement Example 1. Arrangement Example 2 has a structure as shown in FIG. 50.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a magnetic memory device, comprising:
    forming a nonmagnetic layer on a first magnetic layer;
    forming a second magnetic layer on the nonmagnetic layer;
    forming a mask on the second magnetic layer; and
    etching the second magnetic layer using a gas;
    wherein etching the second magnetic layer includes forming an amorphous state in the nonmagnetic layer.

2. The method of claim 1, wherein the gas of the etching contains neon.

3. The method of claim 1, further comprising:
    forming a third magnetic layer;
    forming a metal layer on the third magnetic layer;
    etching the metal layer using a gas mainly containing neon; and
    forming the first magnetic layer on the metal layer.

4. The method of claim 3, wherein the metal layer contains ruthenium.

5. A method of manufacturing a magnetic memory device, comprising:
    forming a nonmagnetic layer on a first magnetic layer;
    forming a second magnetic layer on the nonmagnetic layer;
    forming a first metal layer on the second magnetic layer;
    performing annealing after formation of the first metal layer; and
    etching the first metal layer and part of the second magnetic layer using a gas mainly containing neon after the annealing.

6. The method of claim 5, wherein an impurity contained in the second magnetic layer diffuses into the first metal layer by the annealing.

7. The method of claim 5, further comprising etching the first magnetic layer using the gas mainly containing neon before formation of the nonmagnetic layer, and wherein etching the first magnetic layer includes forming an amorphous state in the first magnetic layer.

8. The method of claim 7, wherein the first magnetic layer changes from the amorphous state to the crystalline state by the annealing.

9. The method of claim 5, wherein atoms that constitute the first metal layer are implanted into the second magnetic layer by the etching, and an upper portion of the second magnetic layer changes to an amorphous state.

10. The method of claim 9, wherein the metal layer contains one of tantalum and molybdenum.

11. The method of claim 5, further comprising:
    forming a third magnetic layer;
    forming a second metal layer on the third magnetic layer;
    etching the second metal layer using the gas mainly containing neon; and
    forming the first magnetic layer on the second metal layer.

12. The method of claim 11, wherein the second metal layer contains ruthenium.

13. The method of claim 5, wherein the first magnetic layer or the second magnetic layer contains cobalt or iron.

* * * * *